United States Patent
Abdo

(10) Patent No.: US 10,396,782 B2
(45) Date of Patent: *Aug. 27, 2019

(54) LOSSLESS VARIABLE TRANSMISSION REFLECTION SWITCH CONTROLLED BY THE PHASE OF A MICROWAVE DRIVE

(71) Applicant: INTERNATIONAL BUSINESS MACHINES CORPORATION, Armonk, NY (US)

(72) Inventor: Baleegh Abdo, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/100,714

(22) Filed: Aug. 10, 2018

(65) Prior Publication Data

US 2019/0123744 A1 Apr. 25, 2019

Related U.S. Application Data

(63) Continuation of application No. 15/787,885, filed on Oct. 19, 2017, now Pat. No. 10,103,730.

(51) Int. Cl.
*H01P 5/12* (2006.01)
*H03K 3/38* (2006.01)
(Continued)

(52) U.S. Cl.
CPC ............ *H03K 17/92* (2013.01); *H01P 1/182* (2013.01); *H01P 5/184* (2013.01)

(58) Field of Classification Search
CPC ............ H01P 5/12; H03K 3/38; H03K 17/92; 6N 99/002; B82Y 10/00
See application file for complete search history.

(56) References Cited

U.S. PATENT DOCUMENTS 4,210,921 A  7/1980  Faris
4,361,768 A  11/1982  Rajeevakumar
(Continued)

FOREIGN PATENT DOCUMENTS

CN  102005631 B  11/2012
CN  104345758 A  2/2015
(Continued)

OTHER PUBLICATIONS

Baleegh Abdo, "Lossless Variable Transmission Reflection Switch Controlled by the Phase of a Microwave Drive," Related Application, U.S. Appl. No. 15/787,885, filed Oct. 19, 2017.
(Continued)

*Primary Examiner* — An T Luu
(74) *Attorney, Agent, or Firm* — Cantor Colburn LLP; Grant Johnson

(57) ABSTRACT

A technique relates to a microwave switch. A first nondegenerate device includes a first port and a second port. A second nondegenerate device includes another first port and another second port, the second port being coupled to the another second port, where the first nondegenerate device and the second nondegenerate device are configured to receive a phase difference in microwave drives. A first input/output port is coupled to the first port and the another first port. A second input/output port is coupled to the first port and the another first port, where communication between the first input/output port and the second input/output port is based on the phase difference.

20 Claims, 23 Drawing Sheets

(51) Int. Cl.
*H03K 17/92* (2006.01)
*H01P 5/18* (2006.01)
*H01P 1/18* (2006.01)

(56) References Cited

U.S. PATENT DOCUMENTS

| | | | |
|---|---|---|---|
| 4,779,065 | A | 10/1988 | Katz et al. |
| 5,326,986 | A | 7/1994 | Miller, Jr. et al. |
| 5,856,713 | A | 1/1999 | Hunter et al. |
| 6,275,121 | B1 | 8/2001 | Sasaki et al. |
| 6,667,670 | B2 | 12/2003 | Hong et al. |
| 6,750,794 | B1 | 6/2004 | Durand et al. |
| 6,803,838 | B2 | 10/2004 | Hoyland |
| 6,951,941 | B2 | 10/2005 | Kwiatkowski |
| 7,671,697 | B2 | 3/2010 | Mun et al. |
| 8,611,974 | B2 | 12/2013 | Maibaum et al. |
| 9,236,644 | B2 | 1/2016 | Czajkowski |
| 9,548,742 | B1 | 1/2017 | Abdo |
| 9,697,473 | B2 * | 7/2017 | Abdo ............... G06N 99/002 |
| 9,735,776 | B1 | 8/2017 | Abdo et al. |
| 9,768,771 | B2 | 9/2017 | Naaman |
| 9,806,711 | B1 * | 10/2017 | Abdo ............... H03K 17/92 |
| 10,103,730 | B1 | 10/2018 | Abdo |
| 2002/0080775 | A1 | 6/2002 | Engbersen et al. |
| 2005/0243708 | A1 | 11/2005 | Bunyk |
| 2009/0119072 | A1 | 5/2009 | Huettner et al. |
| 2017/0077381 | A1 | 3/2017 | Abdo |

FOREIGN PATENT DOCUMENTS

| | | |
|---|---|---|
| CN | 104848880 A | 8/2015 |
| WO | 2015057839 A1 | 4/2015 |

OTHER PUBLICATIONS

Baleegh Abdo, "Lossless Switch Controlled by the Phase of a Microwave Drive," Related Application, U.S. Appl. No. 15/787,915, filed Oct. 19, 2017.

List of IBM Patents or Patent Applications Treated as Related; (Appendix P), Filed Aug. 10, 2018; pp. 1-2.

Baleegh Abdo, "Lossless Switch Controlled by the Phase of a Microwave Drive," U.S. Appl. No. 16/382,248, filed Apr. 12, 2019.

Beha, H., "Asymmetric 2-Josephson-junction interferometer as a logic gate," Electronics Letters, vol. 13, No. 7, Mar. 31, 1977, pp. 218-220.

List of IBM Patents or Patent Applications Treated As Related; Date Filed: Apr. 12, 2019, 2 pages.

Vendik, Irina B., et al., "Commutation Quality Factor of Two-State Switchable Devices," IEE Transactions on Microwave Theory and Techniques, vol. 48, No. 5, May 5, 2000.

International Search Report and Written Opinion for PCT/IB2017/057446 dated Jul. 20, 2018 (10 pages).

* cited by examiner

Open switch:

$$[S] = \begin{pmatrix} 1 & 0 \\ 0 & 1 \end{pmatrix}$$

Closed switch:

$$[S] = \begin{pmatrix} 0 & i \\ i & 0 \end{pmatrix}$$

OPERATING AT THE 50:50 BEAM SPLITTER POINT $r_1 = r_2 = r = 1/\sqrt{2}$ $|t_1| = |t'_1| = |t_2| = |t'_2| = |t| = 1/\sqrt{2}$ $|\alpha| = 1$ For $\varphi_d = 0$ and on resonance $\quad [S] = -i \begin{pmatrix} \cos(\varphi) & -\sin(\varphi) \\ \sin(\varphi) & \cos(\varphi) \end{pmatrix}$ For $\underline{\varphi = 0}$ $\Rightarrow [S] = \begin{pmatrix} 1 & 0 \\ 0 & 1 \end{pmatrix}$ PORT 2
PUMPS
Switch open
PORT 1
400

OPERATING AT THE 50:50 BEAM SPLITTER POINT $r_1 = r_2 = r = 1/\sqrt{2}$ $|t_1| = |t'_1| = |t_2| = |t'_2| = |t| = 1/\sqrt{2}$ $|\alpha| = 1$ For $\varphi_d = 0$ and on resonance $\quad [S] = -i \begin{pmatrix} \cos(\varphi) & -\sin(\varphi) \\ \sin(\varphi) & \cos(\varphi) \end{pmatrix}$ For $\varphi = \pi/2$ $\Longrightarrow \quad [S] = \begin{pmatrix} 0 & -1 \\ 1 & 0 \end{pmatrix}$

OPERATING AT THE 25:75 BEAM SPLITTER POINT $r_1 = r_2 = r = 1/2$ $|t_1| = |t'_1| = |t_2| = |t'_2| = |t| = \sqrt{3}/4$ $|\alpha| = 1$ For $\varphi_d = 0$ and on resonance $\quad [S] = -i \begin{pmatrix} \cos(\varphi) & -\sin(\varphi) \\ \sin(\varphi) & \cos(\varphi) \end{pmatrix}$ For $\underline{\varphi = 0}$ $\Longrightarrow [S] = \begin{pmatrix} 1 & 0 \\ 0 & 1 \end{pmatrix}$

OPERATING AT THE 25:75 BEAM SPLITTER POINT $r_1 = r_2 = r = 1/2$ $|t_1| = |t'_1| = |t_2| = |t'_2| = |t| = \sqrt{3}/4$ $|\alpha| = 1$ For $\varphi_d = 0$ and on resonance $\quad [S] = -i \begin{pmatrix} \cos(\varphi) & -\sin(\varphi) \\ \sin(\varphi) & \cos(\varphi) \end{pmatrix}$ For $\varphi = \pi/2$ $\quad \Longrightarrow \quad [S] = \begin{pmatrix} 0 & -1 \\ 1 & 0 \end{pmatrix}$

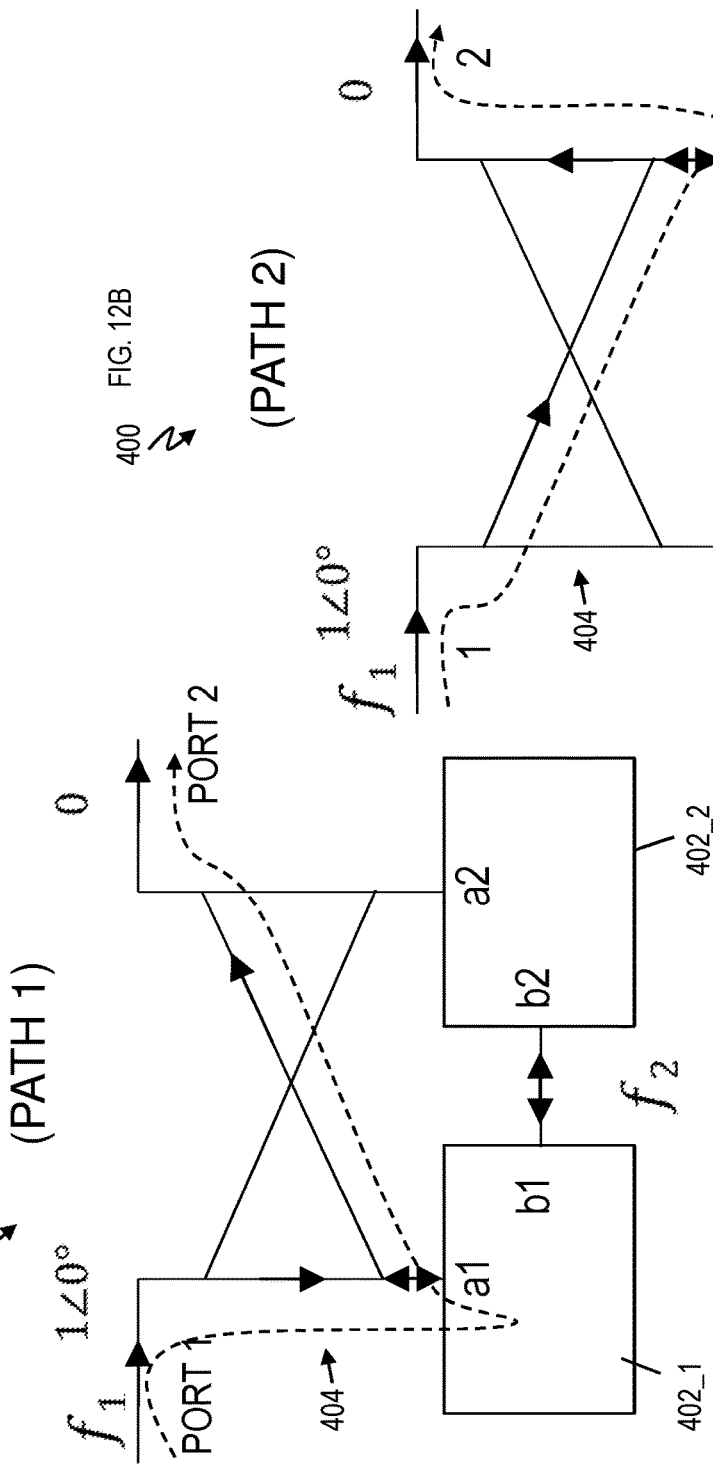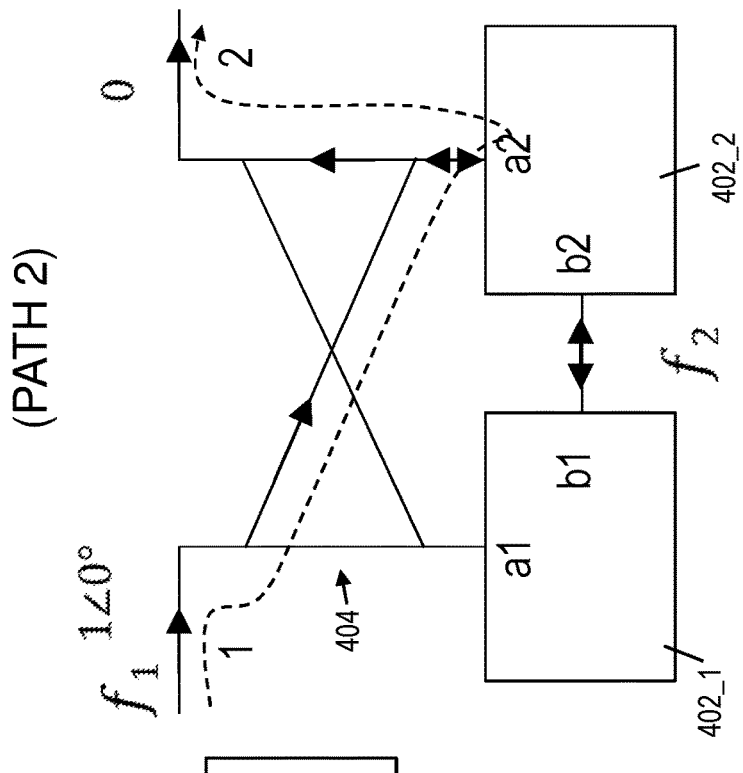

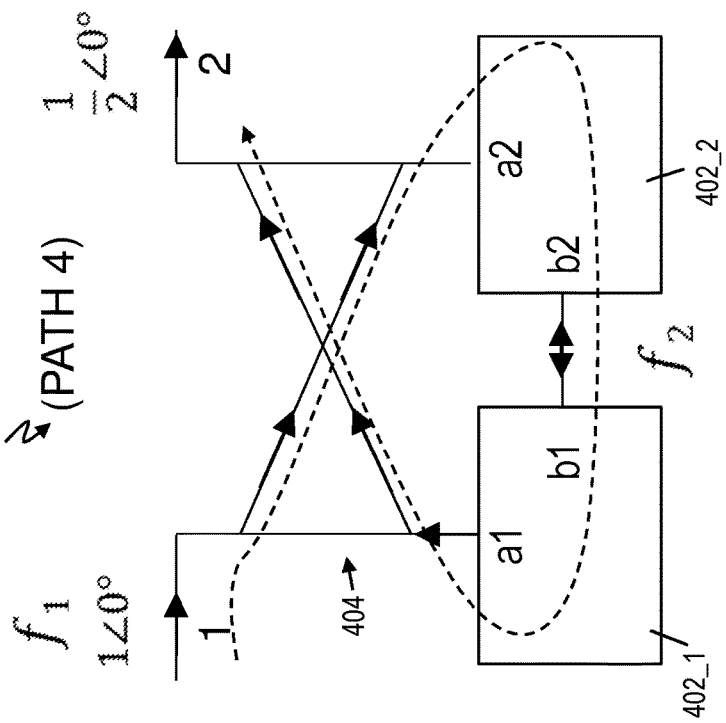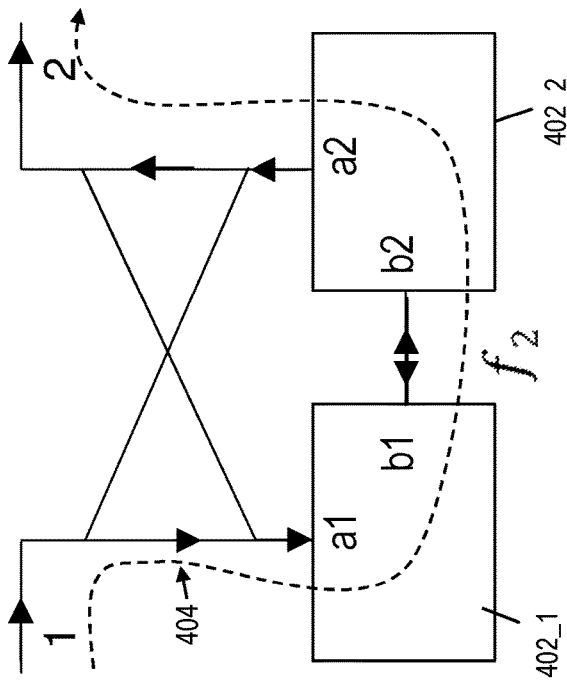

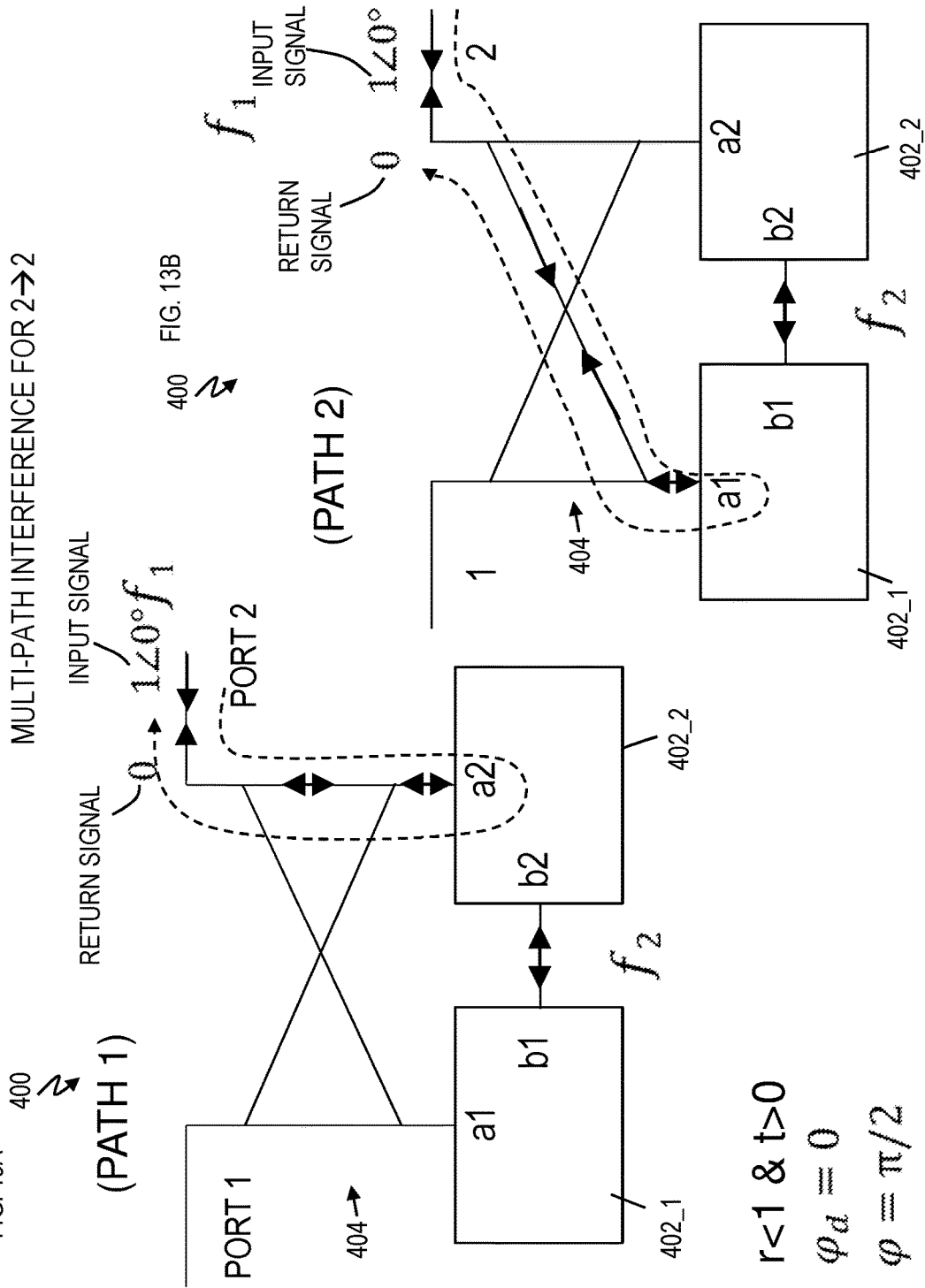

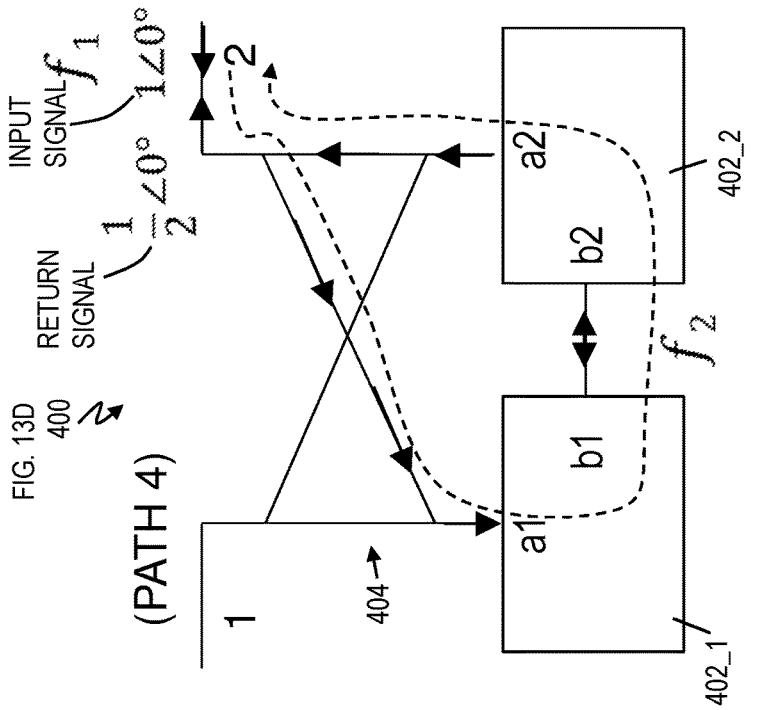
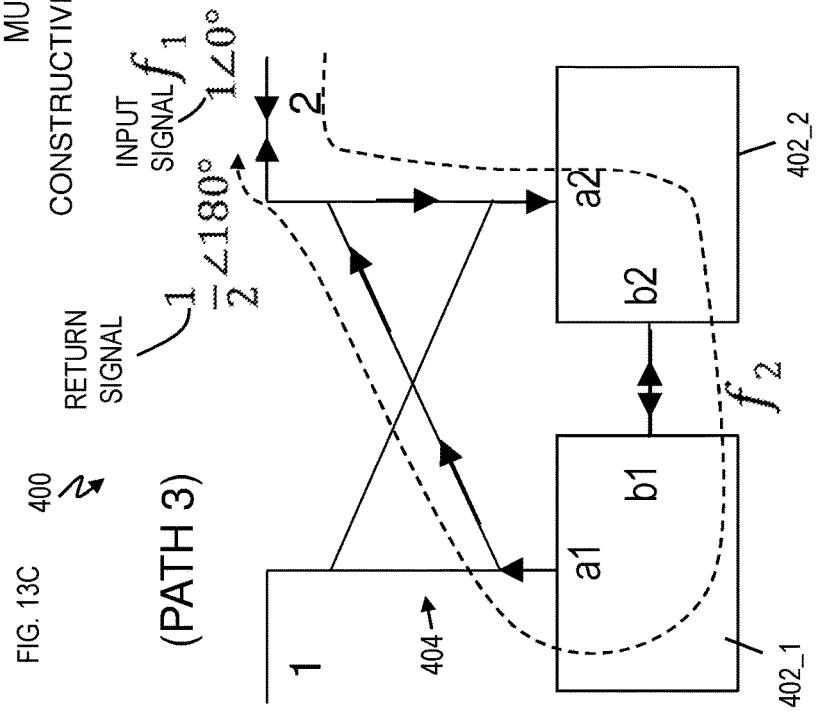

FIG. 14    TABLE 1400

| | |
|---|---|
| (1) | Switch is closed (connected): Reciprocal transmission $[S] = \begin{pmatrix} 0 & 1 \\ 1 & 0 \end{pmatrix}$<br>Conditions: pump OFF, r=1, t=0 |
| (2) | Switch is closed (connected): Nonreciprocal transmission (gyration)<br>Conditions: pump ON, $0 \leq r < 1$, $0 < t \leq 1$   For $\varphi_d = 0$:<br>$[S] = \begin{pmatrix} 0 & -1 \\ 1 & 0 \end{pmatrix}$   or   $[S] = \begin{pmatrix} 0 & 1 \\ -1 & 0 \end{pmatrix}$<br>$\varphi = \pi/2$                  $\varphi = -\pi/2$ |
| (3) | Switch is closed (connected): Variable transmission-reflection beam splitter<br>Conditions: pump ON, $0 \leq r < 1$, $0 < t \leq 1$, $\varphi \bmod 2\pi \neq 0, \pm \pi/2$   $[S] = \begin{pmatrix} \cos(\varphi) & -\sin(\varphi) \\ \sin(\varphi) & \cos(\varphi) \end{pmatrix}$<br>For $\varphi_d = 0$: |
| (4) | Switch is open (disconnected): unity reflection with the same phase<br>Conditions: pump ON, $0 \leq r < 1$, $0 < t \leq 1$   For $\varphi_d = 0$   $[S] = \begin{pmatrix} 1 & 0 \\ 0 & 1 \end{pmatrix}$<br>$\varphi \bmod 2\pi = 0$ |
| (5) | Switch is open (disconnected): unity reflection with phase negation<br>Conditions: pump ON, $0 \leq r < 1$, $0 < t \leq 1$   For $\varphi_d = 0$   $[S] = \begin{pmatrix} -1 & 0 \\ 0 & -1 \end{pmatrix}$<br>$\varphi \bmod 2\pi = \pi$ |

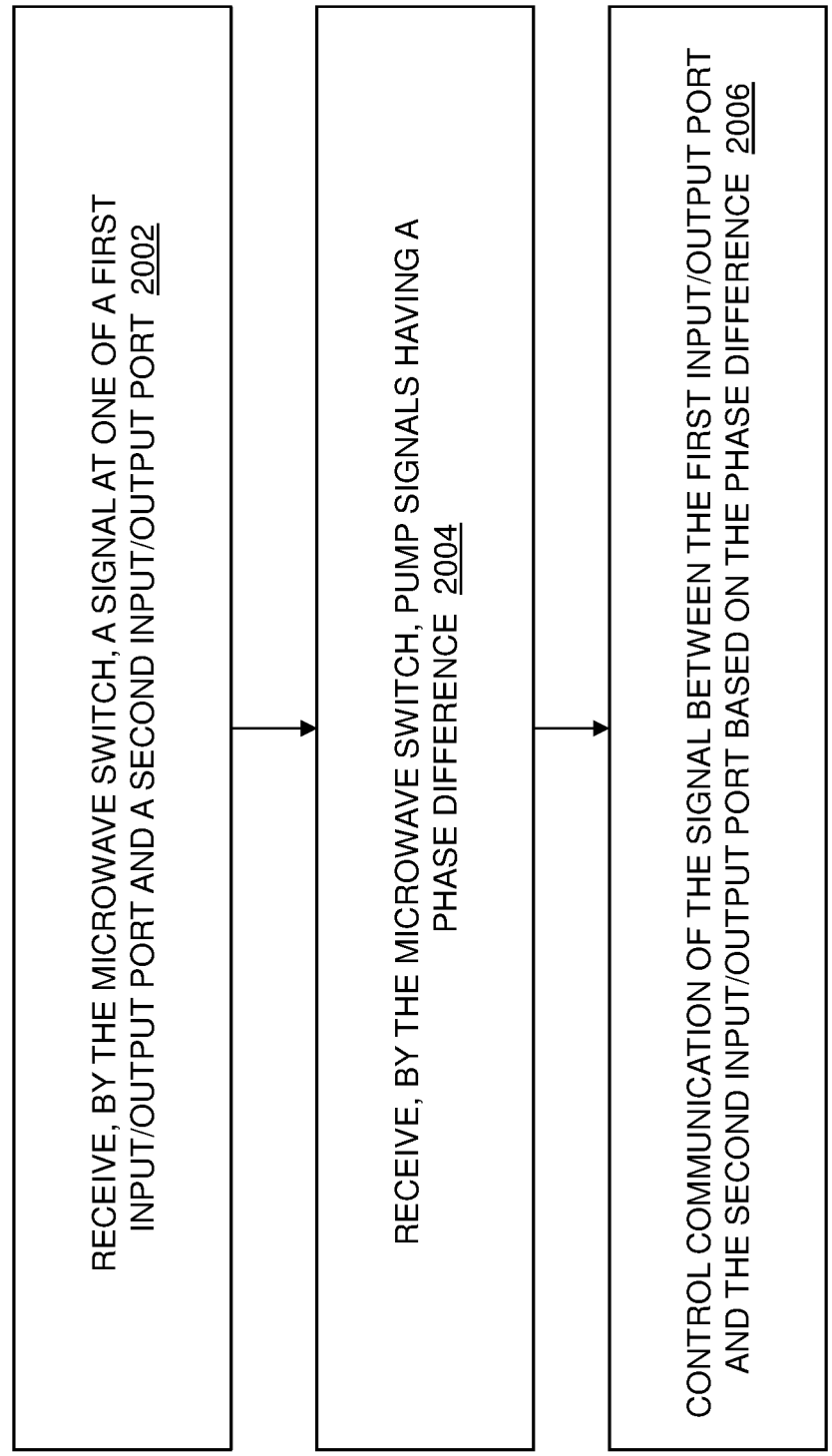

LOSSLESS VARIABLE TRANSMISSION REFLECTION SWITCH CONTROLLED BY THE PHASE OF A MICROWAVE DRIVE

DOMESTIC PRIORITY

This application is a continuation of U.S. application Ser. No. 15/787,885, titled "LOSSLESS VARIABLE TRANSMISSION REFLECTION SWITCH CONTROLLED BY THE PHASE OF A MICROWAVE DRIVE" filed Oct. 19, 2017, the contents of which are incorporated by reference herein in their entirety.

BACKGROUND

The present invention generally relates to superconducting devices, and more specifically, to a microwave switch such as a lossless, variable transmission-reflection switch that is fully controlled by the phase of a microwave drive.

A microwave switch or radio frequency switch is a device to route high frequency signals through transmission paths. RF and microwave switches are used extensively in microwave test systems for signal routing between instruments and devices under test (DUT). Incorporating a switch into a switch matrix system enables the system to route signals from multiple instruments to single or multiple DUTs. This allows multiple tests to be performed with the same setup, thus eliminating the need for frequent connects and disconnects. The entire testing process can be automated, which increases system throughput in high-volume production environments like other electrical switches, RF and microwave switches provide different configurations for many different applications.

Superconducting quantum computing is an implementation of a quantum computer in superconducting electronic circuits. Quantum computation studies the application of quantum phenomena for information processing and communication. Various models of quantum computation exist, and the most popular models incorporate the concepts of qubits and quantum gates. A qubit is a generalization of a bit that has two possible states, but can be in a quantum superposition of both states. A quantum gate is a generalization of a logic gate, however the quantum gate describes the transformation that one or more qubits will experience after the gate is applied on them, given their initial state.

The electromagnetic energy associated with the qubit can be stored in so-called Josephson junctions and in the capacitive and inductive elements that are used to form the qubit. In one example, to read out the qubit state, a microwave signal is applied to the microwave readout cavity that couples to the qubit at the cavity frequency. The transmitted (or reflected) microwave signal goes through multiple thermal isolation stages and low-noise amplifiers that are required to block or reduce the noise and improve the signal-to-noise ratio. The microwave signal is measured at room temperature. The amplitude and/or phase of the returned/output microwave signal carry information about the qubit state, such as whether the qubit is at the ground or excited states or at a superposition of the two states. A microwave switch can be utilized in the communication of quantum signals associated with qubits, qubit gates, and quantum communications in general.

SUMMARY

Embodiments of the present invention are directed to a microwave switch. A non-limiting example of the microwave switch includes a first nondegenerate device including a first port and a second port. The microwave switch includes a second nondegenerate device including another first port and another second port, the second port being coupled to the another second port, wherein the first nondegenerate device and the second nondegenerate device are configured to receive a phase difference in microwave drives. The microwave switch includes a first input/output port coupled to the first port and the another first port and a second input/output port coupled to the first port and the another first port, wherein communication between the first input/output port and the second input/output port is based on the phase difference.

Embodiments of the present invention are directed to a method of configuring a microwave switch. A non-limiting example of the method includes providing a first nondegenerate device including a first port and a second port and a second nondegenerate device comprising another first port and another second port, the second port being coupled to the another second port, where the first nondegenerate device and the second nondegenerate device are configured to receive a phase difference in microwave drives. The method includes coupling a first input/output port to the first port and the another first port and coupling a second input/output port to the first port and the another first port, wherein communication between the first input/output port and the second input/output port is based on the phase difference.

Embodiments of the present invention are directed to a microwave switch. A non-limiting example of the microwave switch includes a first Josephson parametric converter comprising a Signal port and an Idler port and a second Josephson parametric converter comprising another Signal port and another Idler port, the Signal port and the another Signal port being coupled together, where the first and second Josephson parametric converters are configured to receive a phase difference in microwave drives. The microwave switch includes a first input/output port and a second input/output port coupled to the Signal port and the another Signal port, such that communication between the Signal and another Signal ports is based on the phase difference.

Embodiments of the present invention are directed to a method of configuring a microwave switch. A non-limiting example of the method includes providing a first Josephson parametric converter comprising a Signal port and an Idler port and a second Josephson parametric converter comprising another Signal port and another Idler port. The method includes coupling the Signal port to the another Signal port, wherein the first and second Josephson parametric converters are configured to receive a phase difference in microwave drives. Also, the method includes coupling a first input/output port and a second input/output port to the Signal port and the another Signal port, such that communication between the first and second input/output ports is based on the phase difference.

Embodiments of the present invention are directed to a method of operating a microwave switch. A non-limiting example of the method includes receiving, by the microwave switch, a signal at one of a first input/output port and a second input/output port. The method includes receiving, by the microwave switch, pump signals having a phase difference and controlling communication of the signal between the first input/output port and the second input/output port based on the phase difference.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 12A depicts path 1 of the microwave switch for $S_{21}$ according to embodiments of the present invention;

FIG. 12B depicts path 2 of the microwave switch for $S_{21}$ according to embodiments of the present invention;

FIG. 12C depicts path 3 of the microwave switch for $S_{21}$ according to embodiments of the present invention;

FIG. 12D depicts path 4 of the microwave switch for $S_{21}$ according to embodiments of the present invention;

FIG. 13A depicts path 1 of the microwave switch for $S_{22}$ according to embodiments of the present invention;

FIG. 13B depicts path 2 of the microwave switch for $S_{22}$ according to embodiments of the present invention;

FIG. 13C depicts path 3 of the microwave switch for $S_{22}$ according to embodiments of the present invention;

FIG. 13D depicts path 4 of the microwave switch for $S_{22}$ according to embodiments of the present invention;

FIG. 14 depicts a table of the five operational modes of the microwave switch according to embodiments of the present invention;

FIG. 20 depicts a flow chart of a method of operating a microwave switch according to embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor and/or superconducting devices and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor and/or superconducting devices and semiconductor/superconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, as previously noted herein, a microwave switch or radio frequency switch is a device to route high frequency signals through transmission paths. Known microwave switches suffer from a variety of shortcomings. For example, known microwave switches have less than unity transmission, are not scalable because the transmission will drop further, and have possible parasitic coupling between their inputs and outputs. Other problems with known microwave switches include that bandwidths of the resonators and narrow-band hybrids effectively limit the maximum bandwidth that can be achieved to approximately 150 megahertz (MHz), having four ports but only three being used, and requiring critical matching between the two resonator arms.

Figure 4:
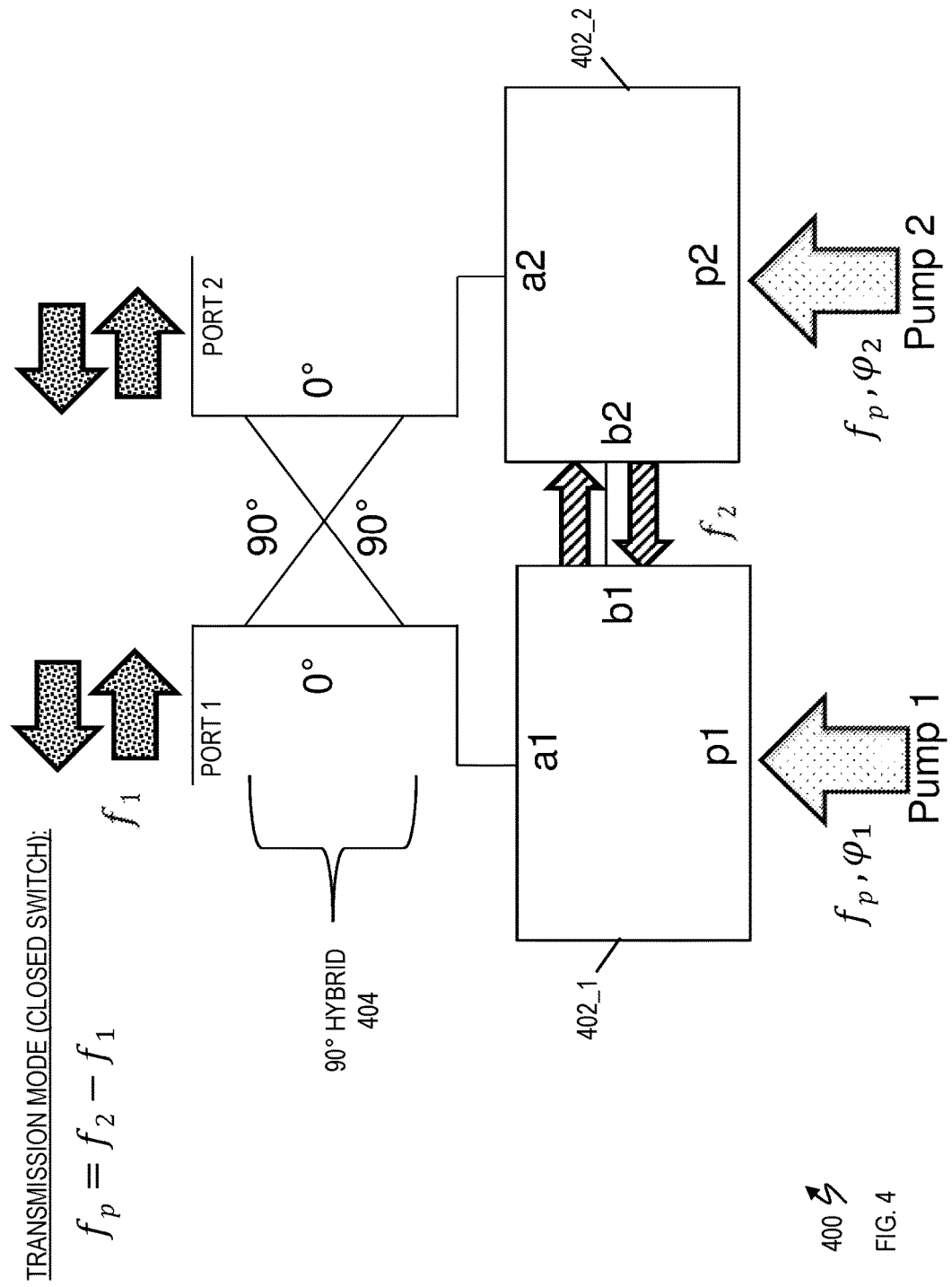
FIG. 4 depicts a lossless or superconducting variable-transmission two-port microwave switch according to embodiments of the present invention.

Turning now to an overview of the aspects of the invention, one or more embodiments of the invention address the above-described shortcomings of the prior art by providing a lossless superconducting microwave switch (e.g., as depicted in FIG. 4) that can be used in routing quantum and/or control signals in scalable quantum processor architectures and quantum networks. The lossless, superconducting microwave component can be implemented as a microwave device such as a microwave switch. The microwave device/switch is configured with the following scattering matrix $$[S] = \begin{pmatrix} r & t \\ t' & r \end{pmatrix} = \begin{pmatrix} \cos\varphi & -\sin\varphi \\ \sin\varphi & \cos\varphi \end{pmatrix}$$

where $\varphi$ is a phase difference of the pump drives feeding the device. This device can be used as a lossless microwave switch. It conserves the frequency of the transmitted signal. The scattering parameters depend on the pump phase (but not amplitude). For full range control, it is sufficient to vary $\varphi$ in the range from about 0 to about $\pi/2$.

Further, one or more embodiments of the invention provide a microwave device that realizes an on-chip two-port microwave switch (or PCB integrated switch). The microwave device transmits or blocks (reflects) microwave signals. The microwave device supports five modes of operation: reflector with same phase, reflector with phase negation, reciprocal transmission, nonreciprocal transmission, and/or variable-transmission-reflection beam-splitter. In embodiments of the invention, the microwave device can include two nondegenerate Josephson three-wave mixers, one 90° hybrid coupler, and one 180° hybrid coupler for the pump signal. Also, the microwave device (i.e., microwave switch) can include an optional phase shifter on one arm of the pump feeding the two three-wave mixers. The two nondegenerate three-wave mixing Josephson elements can be coupled back-to-back with or without a delay line in between. The two nondegenerate three-wave mixing Josephson elements perform upconversion/downconversion of signals in transmission. The nondegenerate three-wave mixing devices are operated in noiseless frequency conversion mode (i.e., no photon gain). One condition on their working point is that both nondegenerate three-wave mixing devices (e.g., Josephson parametric converters (JPCs)) are operated at the same working point, i.e., have equal reflection parameters and equal amplitude for their transmission parameter. Thus, the nondegenerate three-wave mixing devices function as active beam splitters such that each active beam splitter has three physically separated ports. One port supports signals at frequency $f_1$. Another port supports signals at frequency $f_2$. A third port allows feeding the pump drive. The pump frequency $f_p$ is equal to the frequency difference between $f_2$ and $f_1$. Without loss of generality we assume $f_2 > f_1$.

More specifically, the above-described aspects of the invention address the shortcomings of the prior art by providing and configuring the microwave device/switch such that the phase difference between the pump drives feeding the two nondegenerate three-wave mixing Josephson devices induces a nonreciprocal phase shift to signals traversing the device. This configuration allows unity transmission and scalability. The two ports of the two active beam splitters that support signals at $f_1$ are connected to a 90° hybrid coupler. The two ports of the two active beam splitters which support signals at $f_2$ are connected together through a delay line in some embodiments of the invention. This shared port (e.g., ports b1 and b2 shown in FIG. 4) supports an internal mode of the device, and the scheme is lossless. The lossless delay line should have an effective electrical length of multiples of pi ($\pi$) radians at the frequency of the ports (e.g., ports b1 and b2) that are connected together. The two active beam splitters are (assumed to be) nominally identical. The scattering parameters of the microwave device at a certain working point are determined by wave interference between 4 principal paths. The scattering parameter on resonance from port i to j (where i,$\in\{1,2\}$) vanishes if the waves that propagate from i to j interfere destructively. The scattering parameter on resonance from port i to j (where i,$\in\{1,2\}$) is (almost or effectively) unity if the waves that propagate from i to j interfere constructively. The nondegenerate three-wave mixers can be realized using JPCs, and the bandwidth of the JPCs can be enhanced using impedance engineering of the feedlines.

Figure 1:
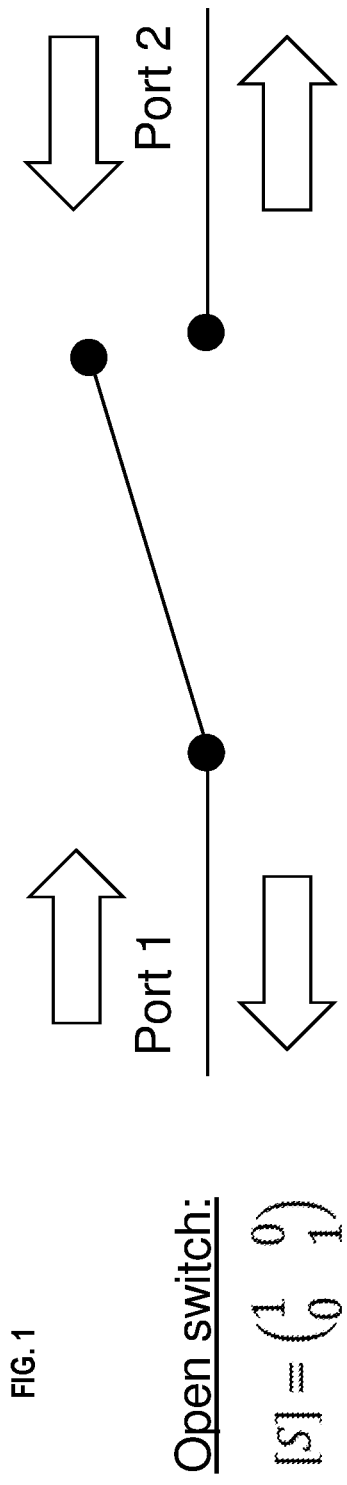
FIG. 1 depicts a two-port microwave switch as an open switch according to embodiments of the present invention.
Figure 2:
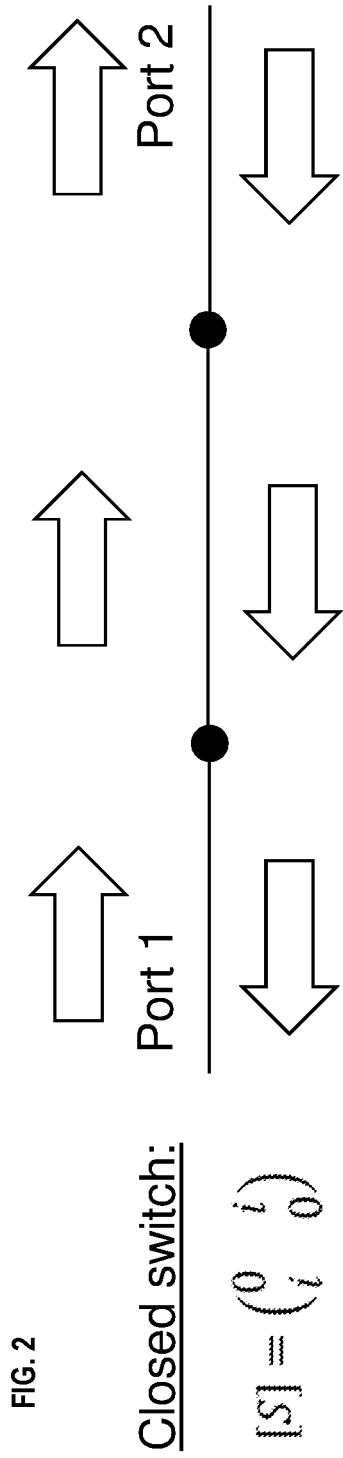
FIG. 2 depicts the two-port microwave switch as a closed switch according to embodiments of the present invention.

Now, turning to the figures, FIG. 1 depicts a two-port microwave switch which is shown as an open switch according to embodiments of the present invention. FIG. 2 depicts the two-port microwave switch which is shown as a closed switch according to embodiments of the present invention.

In FIG. 1, the scattering matrix of an open two-port switch (up to a global phase) is below:

$$[S] = \begin{pmatrix} 1 & 0 \\ 0 & 1 \end{pmatrix}.$$

FIG. 1 shows waves propagating from the left side (port 1) towards the right side (port 2) but are reflected off port 1 with unity reflection. Also, FIG. 1 shows waves propagating from the right side (port 2) towards the left side (port 1) but are reflected off port 2 with unity reflection.

In FIG. 2, the scattering matrix of a closed two-port switch (up to a global phase) is below:

$$[S] = \begin{pmatrix} 0 & i \\ i & 0 \end{pmatrix}.$$

FIG. 2 shows waves propagating from the left side (port 1) towards the right side (port 2) and transmitted to port 2 with unity transmission. Also, FIG. 2 shows waves propagating from the right side (port 2) towards to the left side (port 1) and transmitted to port 1 with unity transmission.

Now, a general scattering matrix for a lossless, variable-transmission microwave switch is provided below:

$$[S] = \begin{pmatrix} r & t \\ t' & r \end{pmatrix}$$

where $|r|^2 + |t|^2 = 1$ and $|r|^2 + |t'|^2 = 1$.

As an example, a microwave switch functioning as a 50:50 beam splitter is considered in which half of the signal power is reflected and half of the signal power is transmitted, where $r=1/\sqrt{2}$, $|t|=1/\sqrt{2}$, and the scattering matrix is given below:

$$[S] = \begin{pmatrix} \frac{1}{\sqrt{2}} & \frac{i}{\sqrt{2}} \\ \frac{i}{\sqrt{2}} & \frac{1}{\sqrt{2}} \end{pmatrix}$$

As another example, a microwave switch as a 25:75 beam splitter is considered in which one-quarter (25%) of the signal power is reflected and three-quarters (75%) of the signal power is transmitted, where $r=\frac{1}{2}$, $|t|=\sqrt{3}/2$, and the scattering matrix is given below:

$$[S] = \begin{pmatrix} \frac{1}{2} & \frac{i\sqrt{3}}{2} \\ \frac{i\sqrt{3}}{2} & \frac{1}{2} \end{pmatrix}.$$

Figure 3:
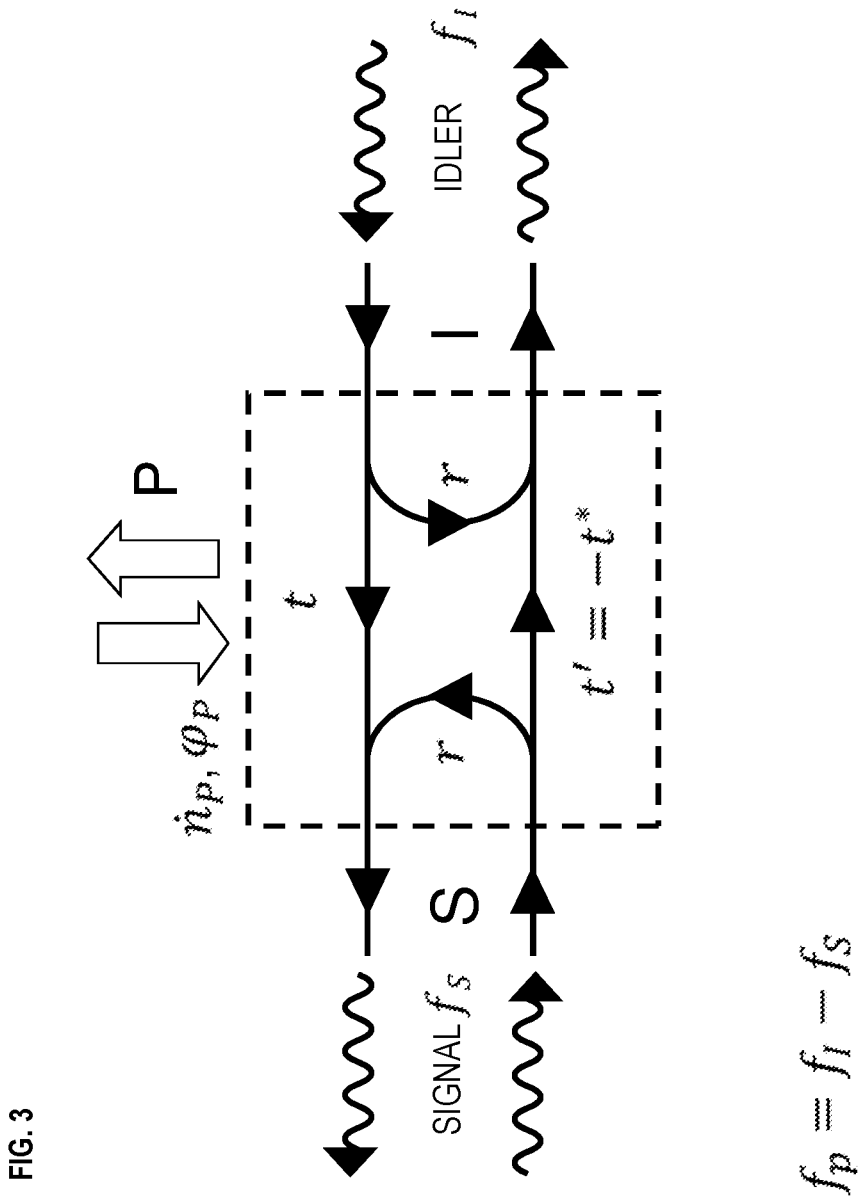
FIG. 3 depicts a signal flow graph for a nondegenerate three-wave mixing device in frequency conversion according to embodiments of the present invention.

FIG. 3 depicts the signal flow graph for a nondegenerate three-wave mixing device operated in frequency conversion (no photon gain) according to embodiments of the present invention. This nondegenerate three-wave mixing device could be used as part of the lossless microwave switch but it does not conserve the frequency of the transmitted signal. Also, the scattering parameters depend on the pump amplitude in FIG. 3. The nondegenerate three-wave mixer can be a Josephson parametric converter (JPC).

On resonance, the nondegenerate three-wave mixer (e.g., JPC) satisfies the following scattering matrix when operated in noiseless frequency conversion:

$$[S] = \begin{pmatrix} r & t \\ t' & r \end{pmatrix} = \begin{pmatrix} \cos\theta & ie^{-i\varphi_P}\sin\theta \\ ie^{i\varphi_P}\sin\theta & \cos\theta \end{pmatrix},$$

where $\tan h(i\theta/2)=i|\rho|$ and $\rho$ is a dimensionless pump amplitude (varies between 0 and 1).

As a modification to the nondegenerate three-wave mixer and as further recognized herein, the phase of the pump $\varphi_p$ (which can be denoted as $\varphi_1$ and $\varphi_2$ for two pump signals) will be utilized in accordance embodiments of the present invention. Since the scattering matrix is unitary, the following relation holds $|r|^2+|t|^2=1$, where r is the reflection coefficient, t is the transmission parameter, and $t'=-t^*$ (where $t^*$ is the conjugate of t). Unitary means that the nondegenerate three wave mixer preserves the energy and the coherence of the phase. The full conversion working point of the superconducting nondegenerate three-wave mixing device is $|r|^2=0$, $|t|^2=1$. At the full conversion working point, there is no reflection and there is full transmission with frequency conversion.

In FIG. 3, the superconducting nondegenerate three-wave mixing device has 3 ports, which are the Signal port (S), the Idler port (I), and the pump port (P). The superconducting nondegenerate three-wave mixing device has transmission t from Idler port to Signal port and transmission t' from Signal port to Idler port. From Idler to Signal port, the Idler microwave signal enters the Idler port at frequency $f_2$, is down converted, and exits the Signal port at frequency $f_1$. From Signal to Idler port, the Signal microwave signal enters the Signal port at frequency $f_1$, is up converted, and exits the Idler port at frequency $f_2$. The pump microwave signal provides the energy for frequency up conversion and frequency down conversion. The pump frequency is $f_p$, where $f_p=f_I-f_s=f_2-f_1$.

FIG. 4 depicts a (superconducting) lossless variable-transmission two-port microwave switch 400 according to embodiments of the present invention. The microwave switch 400 includes two nondegenerate Josephson three-wave mixers 402_1 and 402_2. The microwave switches 402_1 and 402_2 are designed to be the same. For example, the microwave switches 402_1 and 402_2 are identical or nominally identical. The microwave switches 402_1 and 402_2 each have functionally equivalent ports a, b, and p, which are labeled as ports a1, b1, and p1 for microwave switch 402_1 and ports a2, b2, and p2 for microwave switch 402_2. A 90° hybrid coupler 404 is connected to ports a1 and a2 of microwave switches 402_1 and 402_2, respectively. The ports a1 and a2 each are connected to their respective resonators, such as Signal (S) resonators of Josephson parametric converters. The ports b1 and b2 are each connected to their respective resonators, such as Idler (I) resonators of Josephson parametric converters. In the three-wave mixers 402_1, the Signal and Idler resonators are connected to a Josephson ring modulator. Similarly, in the three-wave mixers 402_2, the Signal and Idler resonators are connected to a Josephson ring modulator. The pump ports p1 and p2 can be connected to on-chip flux lines in the form of short-circuited coupled striplines that are capacitively coupled to two adjacent nodes of the JRM 1510. Such pump lines can both support microwave tones at the pump frequency and dc currents that flux bias the JRMs 1510 in the three-wave mixers 402_1 and 402_2. In one implementation, the pump ports p1 and p2 can be connected to the other end of Signal resonator (i.e., not connected to the end with ports a1 and a2). In one implementation, the pump ports p1 and p2 can be connected to the other end of the Idler resonator (i.e., not connected to the end with ports b1 and b2).

The two nondegenerate three-wave mixing Josephson elements 402_1 and 402_2 are coupled back-to-back by ports b1 and b2 with or without a delay line (depicted as delay line 902 in FIG. 9) in between. Port 1 and port 2 are ports of the 90° hybrid coupler 404. Port 1 is the input port when port 2 is the output port assuming the signal flow is from port 1 to port 2. Conversely, when the signal flow is in the opposite direction, port 1 is the output port while port 2 is the input port. The two nondegenerate three-wave mixing Josephson elements 402_1 and 402_2 perform upconversion/downconversion of signals in transmission. The nondegenerate three-wave mixing devices 402_1 and 402_2 are operated in noiseless frequency conversion mode (i.e., no photon gain), and both devices 402_1 and 402_2 are operated at the same working point, i.e., have equal reflection parameters and equal amplitude for their transmission parameter. Thus, the nondegenerate three-wave mixing devices function as active beam splitters. The active beam splitter has three physically separated ports. For example, ports a1 and a2 support signals at $f_1$. Ports b1 and b2 support signals at $f_2$. The pump ports p1 and p2 allow for feeding the pump drive. The pump frequency $f_p$ is equal to the frequency difference between $f_2$ and $f_1$ such that $f_p=f_2-f_1$. For example, pump port p1 of device 402_1 receives a pump signal/drive (pump signal 1) at pump frequency $f_p$ and phase $\varphi_1$. Pump port p2 of device 402_2 receives a pump signal/drive (pump signal 2) at pump frequency $f_p$ and phase $\varphi_2$. The microwave switch 400 is designed to operate as an open switch (i.e., reflection of signal), closed switch (transmission of signal), and/or variable transmission-reflection (transmission of a portion of the signal while reflecting the remaining portion of the signal) based on the pump phase difference between the pump signals feeding pump port p1 of three-wave mixer

402_1 and pump port p2 of three-wave mixer 402_2. The pump phase difference is defined as $\varphi = \varphi_1 - \varphi_2$. The phase difference between the pump drives feeding the two nondegenerate three-wave mixing Josephson devices 402_1 and 402_2 (via pump port p1 and p2, respectively) induces a nonreciprocal phase shift to signals (e.g., signal at $f_1$ through ports 1 and 2) traversing the device 400.

FIG. 4 illustrates the superconducting microwave switch 400 in transmission mode, which means that a signal at frequency $f_1$ is input into port 1 of the hybrid coupler 404, is transmitted via the coupler 404 to three-wave mixers 402_1 and 402_2, and is output through port 1. Conversely, the signal at frequency $f_1$ can be input into port 2 of the hybrid coupler 404, be transmitted via the coupler 404 to the three-wave mixers 402_1 and 402_2, and be output through port 2. In this example, the superconducting microwave switch 400 acts as a closed switch for microwave signals.

Figure 5:
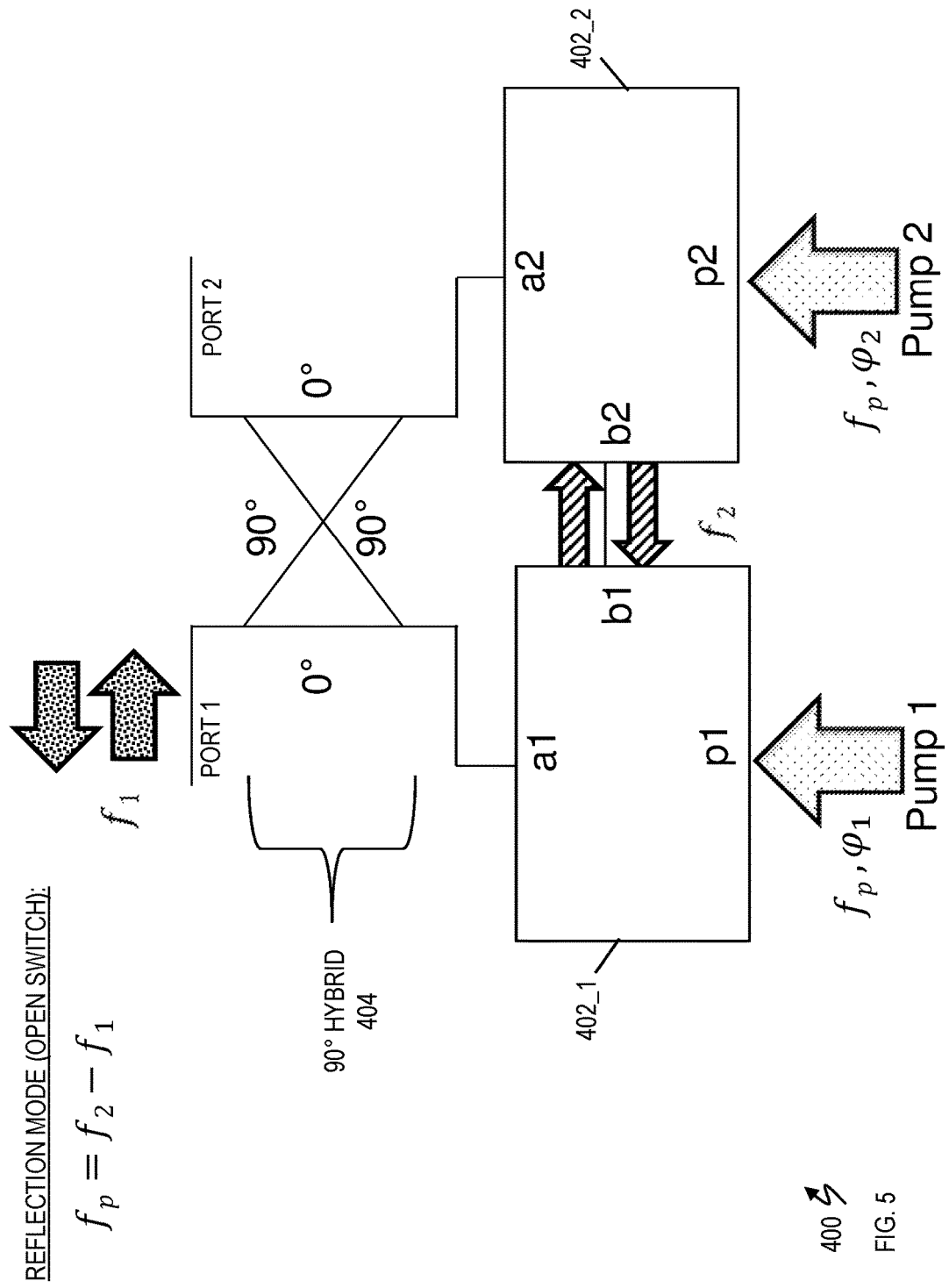
FIG. 5 depicts a lossless variable-transmission two-port microwave switch according to embodiments of the present invention.

FIG. 5 depicts a lossless variable-transmission two-port microwave switch 400 according to embodiments of the present invention. FIG. 5 depicts an example in which the microwave switch 400 is in reflection mode, i.e., operating as an open switch. The phase difference between the pump drives feeding the two nondegenerate three-wave mixing Josephson devices 402_1 and 402_2 (via pump port p1 and p2, respectively) determines if the switch is in the open or closed state. In this example, it is assumed that a signal at frequency $f_1$ is input into port 1 of the hybrid coupler 404. The signal at $f_1$ is reflected back at port 1 and does not output through port 2. Conversely, when the signal at $f_1$ is input to port 2, the signal reflects back to port 2 and is not allowed to be output through port 1.

Figure 6:
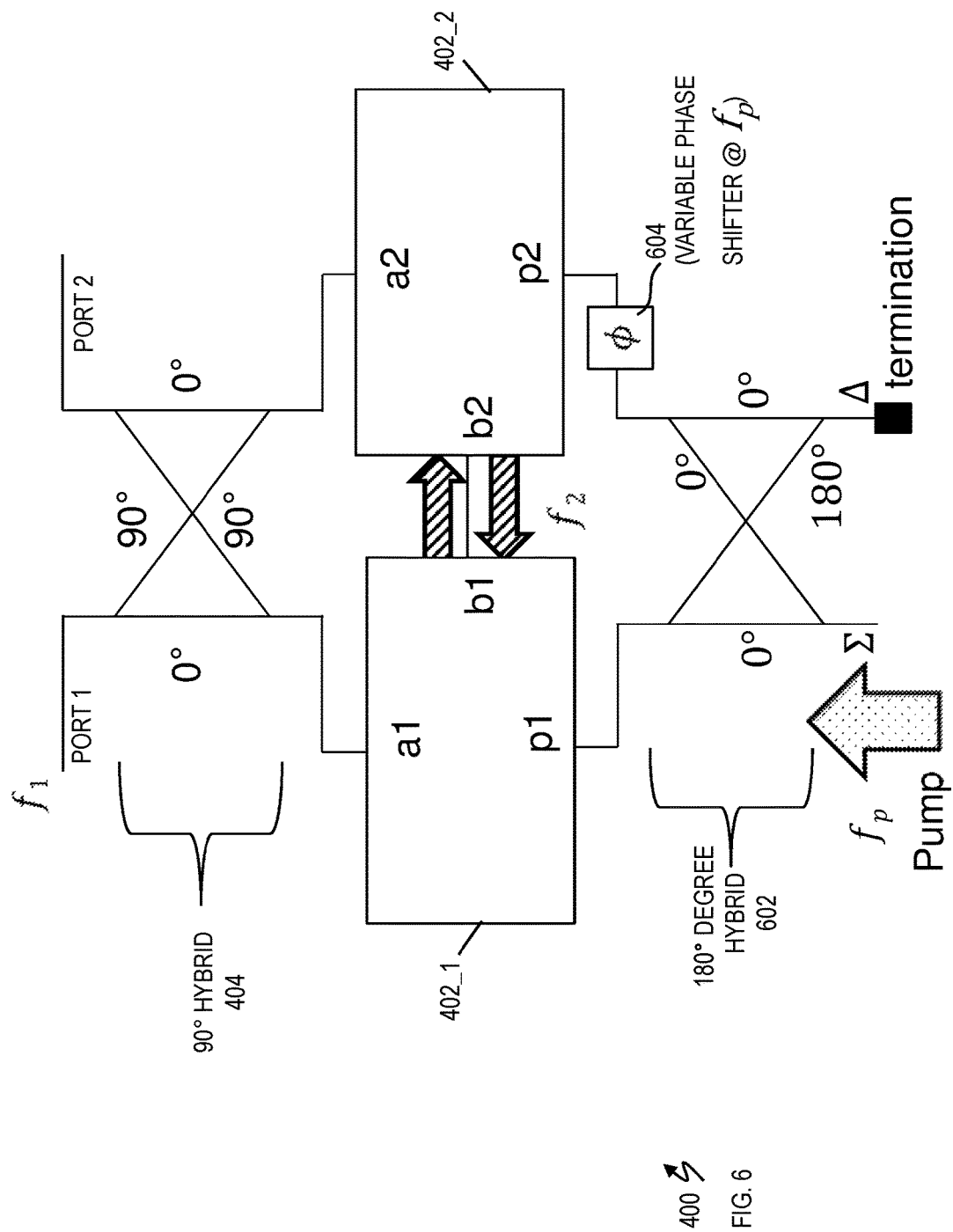
FIG. 6 depicts a lossless variable-transmission two-port microwave switch with a modification to how the pump signal is fed according to embodiments of the present invention.

FIG. 6 depicts a lossless variable-transmission two-port microwave switch 400 with a modification to how the pump signal is fed according to embodiments of the present invention. The microwave switch 400 in FIG. 6 includes the elements FIG. 5. Additionally, the microwave switch 400 includes a 180° hybrid coupler 602 for the pump signal at pump frequency $f_p$. Also, the microwave switch 400 can include a variable phase shifter 604 on one arm of the pump feeding the two three-wave mixers 402_1 and 402_2. After passing through the 180° hybrid coupler 602, the phase shifter 604 causes a phase difference $\varphi$ between the pump signal feeding port p1 and port p2. Therefore, the pump phase difference $\varphi$ between the pump drives feeding the two nondegenerate three-wave mixing Josephson devices 402_1 and 402_2 (via pump port p1 and p2, respectively) induces the nonreciprocal phase shift to signals (e.g., signal at $f_1$ through ports 1 and 2) traversing the device 400.

Figure 15:
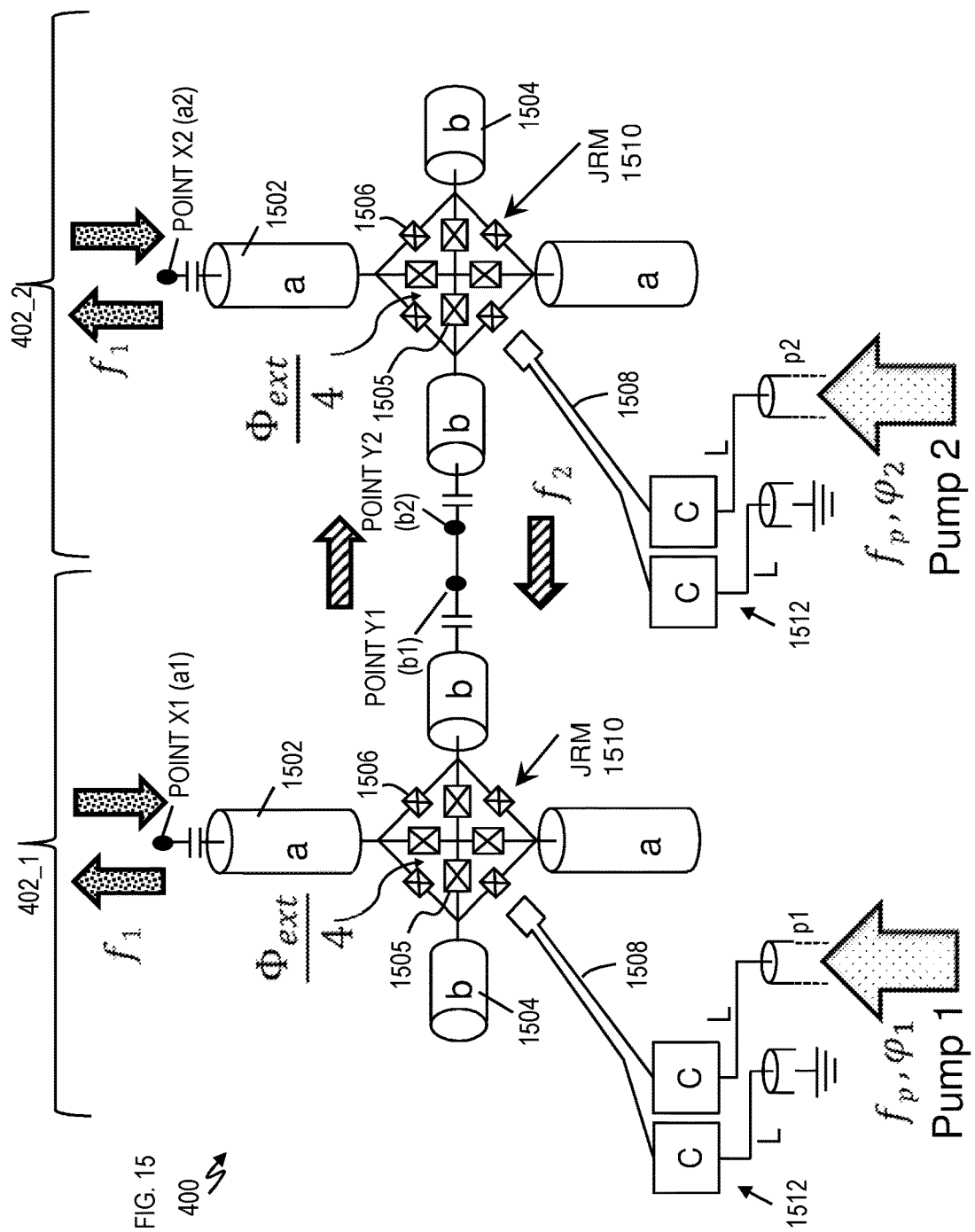
FIG. 15 depicts an example of the microwave switch without illustrating the hybrid coupler according to embodiments of the present invention.

As an example of operating the microwave switch 400 with the 180° hybrid coupler 602, the pump signal at pump frequency $f_p$ is received at the $\Sigma$ port of the 180° hybrid coupler 602 and is split. One-half of the pump signal travels down the straight bar of the 180° hybrid coupler 602 to pump port p1 with a 0° phase shift and the other half travels down the cross bar to pump port p2 with a 0° phase shift. Before reaching port p2, the pump signal undergoes a phase shift (at frequency $f_p$) caused by the variable phase shifter 604. The phase shift by the variable phase shifter 604 causes the phase $\varphi_2$ of pump signal entering port p2 of the three-wave mixer 402_2 to be different from the phase $\varphi_1$ of the pump signal entering port p1 of the three-wave mixer 402_1. Moreover, without requiring two separate pump signals/drives to be input as in FIGS. 4 and 5, the 180° hybrid coupler 602 is configured to use one pump signal to create the two separate pump signals (pump 1 and pump 2) at frequency $f_p$ such that the variable phase shifter 604 creates the phase difference $\varphi = \varphi_1 - \varphi_2$ between pump signal 1 entering port p1 and pump signal 2 entering port p2. As discussed herein, the phase difference determines whether the signal at frequency $f_1$ entering port 1 will be output through port 2 or whether the signal will be reflected back to port 1. Conversely, the phase difference determines whether the signal at frequency $f_1$ entering port 2 will be output through port 1 or whether the signal will be reflected back to port 2. The phase shifter 604 can be implemented in various ways. Examples of the phase shifter 604 include two coupled Josephson parametric converters operated in full frequency conversion and a half-wavelength superconducting resonator with a dc-SQUID (direct current superconducting quantum interference device) embedded at its center. In the former example, the phase difference between the pumps feeding the two JPCs determines the phase shift of the transmitted signals, whereas in the latter example, by tuning the flux threading the dc-SQUID the resonance frequency of the resonator is shifted, which, in turn, shifts the phase of the transmitted signal through the resonator. It is noted that FIG. 15 illustrates an implementation of FIGS. 4, 5, and 6 without showing the hybrid couplers 404 and 602, for simplicity and conciseness.

Figure 7:
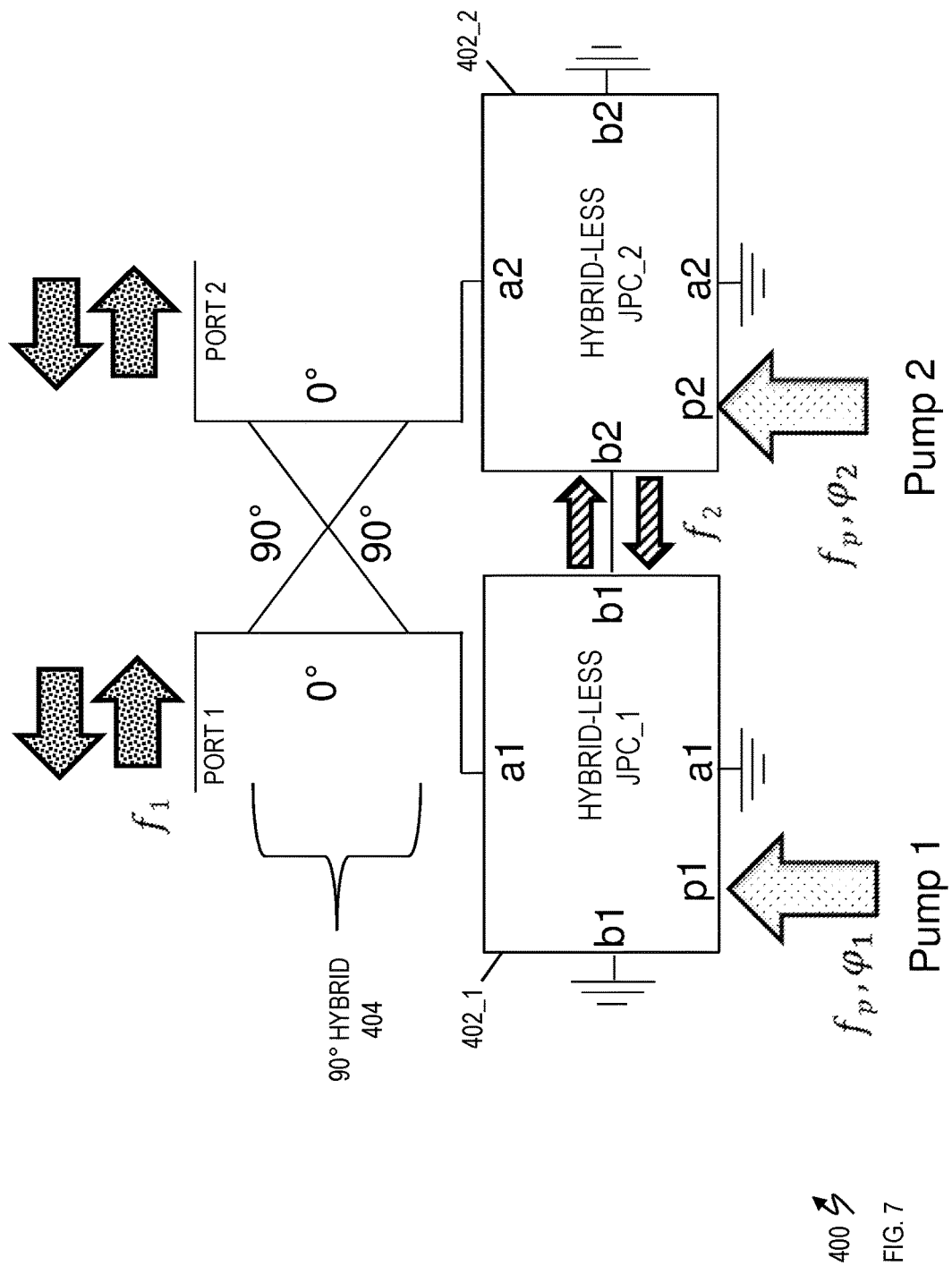
FIG. 7 depicts a lossless variable-transmission two-port microwave switch according to embodiments of the present invention.

FIG. 7 depicts a lossless variable-transmission two-port microwave switch 400 according to embodiments of the present invention. In the three-wave mixer 402_1, port a1 connects to one end of the resonator (e.g., Signal resonator) and the other end is connected to ground. Particularly, the resonator (e.g., Signal resonator) has two feedlines, where one feedline connects to the 90° hybrid coupler 404 (as in FIGS. 4 and 5) and one feedline is connected (shorted) to ground (the same analogously applies to mixer 402_2). In FIGS. 4 and 5, the Signal resonator is connected to one feedline which is one leg of the 90° hybrid coupler 404 (unlike FIG. 7), so only a single port a1 is shown feeding the resonator in the mixer 402_1 (the same analogously applies for mixer 402_2).

Figure 16:
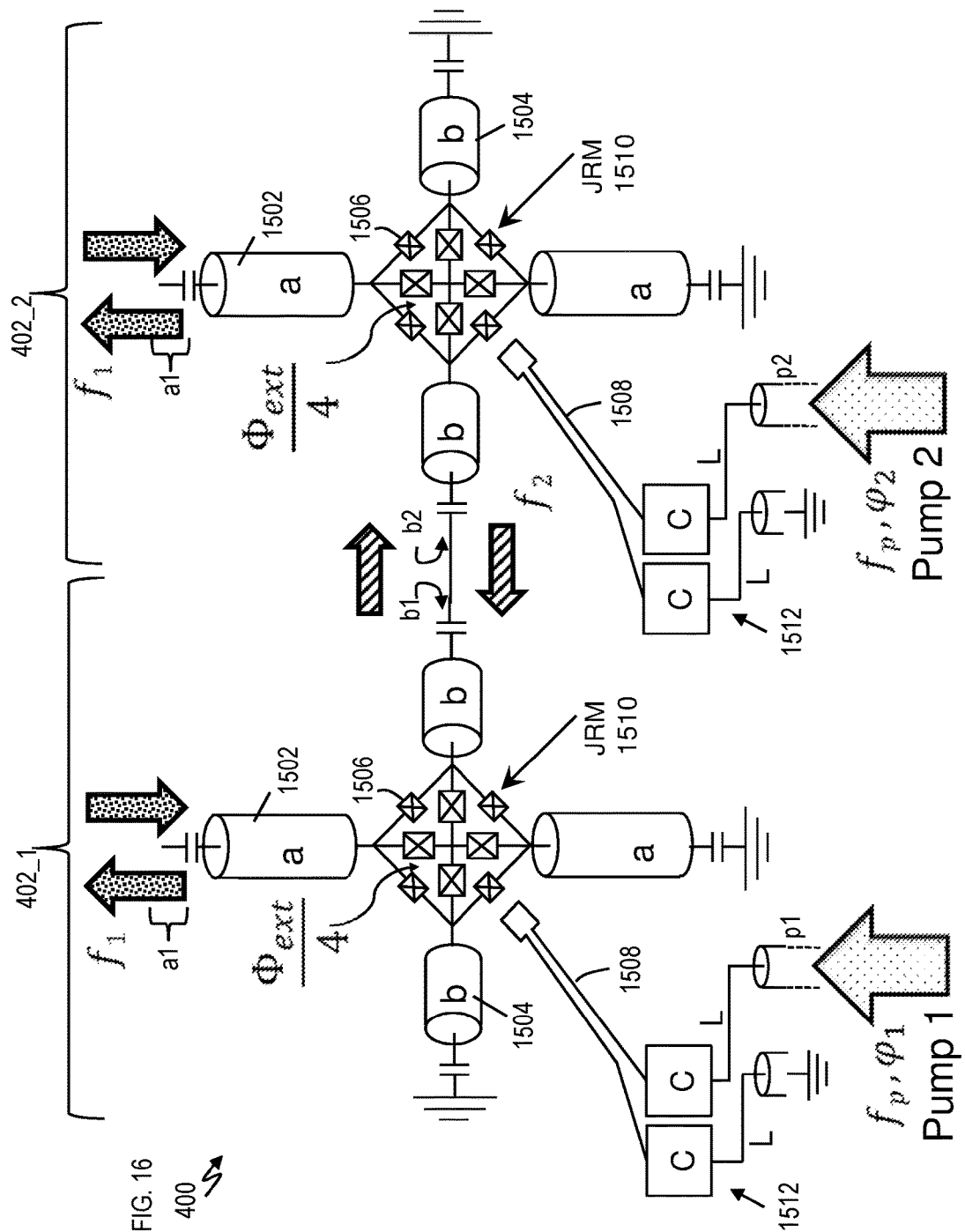
FIG. 16 depicts an example of the microwave switch without illustrating the hybrid coupler according to embodiments of the present invention.

Similarly, for port b1 (the same applies analogously to port b2 in mixer 402_2), port b1 connects to one end of the resonator (e.g., Idler resonator) and the other end is connected to ground. Particularly, the resonator (e.g., Idler resonator) has two feedlines, where one feedline connects to one feedline of the other idler resonator (as in FIGS. 4 and 5) and one feedline is connected (shorted) to ground. By connecting one feedline to ground, the idler or signal resonator is single ended, meaning the input and output signals of the resonator are carried by one feedline only. Just as discussed above, the pump signal 1 is applied at frequency $f_p$ and phase $\varphi_1$ to port p1 while the pump signal 2 is applied at frequency $f_p$ and phase $\varphi_2$ to port p2, in order to create the phase difference $\varphi$. The phase difference determines the operation of the microwave switch 400. Just as discussed in FIG. 4, the superconducting microwave switch 400 in FIG. 7 can operate in transmission mode, which means that the signal at frequency $f_1$ is input into port 1 of the hybrid coupler 404, is transmitted via the coupler 404 to three-wave mixers 402_1 and 402_2, and is output through port 2. Conversely, the signal at frequency $f_1$ can be input into port 2 of the hybrid coupler 404, be transmitted via the coupler 404 to the three-wave mixers 402_1 and 402_2, and be output through port 1. Additionally, just as discussed in FIG. 5, the superconducting microwave switch 400 in FIG. 7 can operate in reflection mode. For the signal at frequency $f_1$ input into port 1 of the hybrid coupler 404, the signal at $f_1$ is reflected back at port 1 and does not output through port 2. Conversely, when the signal at $f_1$ is input to port 2, the signal reflects back to port 2 and is not allowed to be output through port 1. It is noted that FIG. 16 illustrates one implementation of FIG. 7 without showing the hybrid couplers 404 and 602, for simplicity and conciseness.

Figure 8:
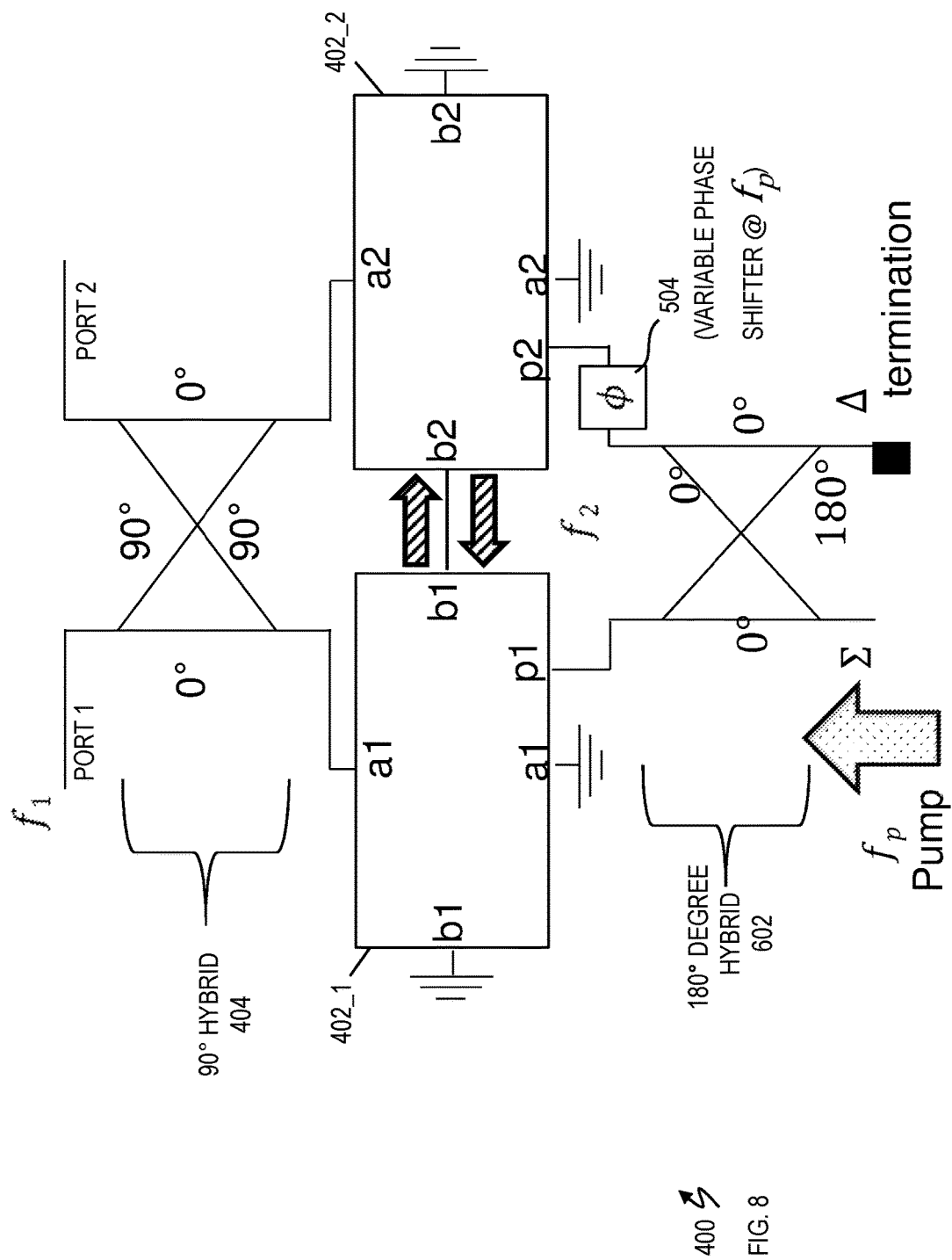
FIG. 8 depicts a lossless variable-transmission two-port microwave switch with a modification to how the pump signal is fed according to embodiments of the present invention.

FIG. 8 depicts a lossless variable-transmission two-port microwave switch 400 with a modification to how the pump signal is fed according to embodiments of the present invention. The microwave switch 400 in FIG. 8 includes the elements discussed herein. In the two three-wave mixers 402_1 and 402_2, ports a1 and a2 connect to two ends of their respective resonator (e.g., Signal resonators) and the resonator has two feedlines, where one feedline connects to the 90° hybrid coupler 404 and one feedline is connected (shorted) to ground. Similarly, for ports b1 and b2 in mixers 402_1 and 402_2, ports b1 and b2 connect to two ends of their respective resonators (e.g., Idler resonators) and the resonator has two feedlines, where one feedline connects to one feedline of the other idler resonator and one feedline is connected (shorted) to ground.

The modified three-wave mixers 402_1 and 402_2 are connected to the 180° hybrid coupler 602 for receiving the pump signal at pump frequency $f_p$ (as discussed in FIG. 6), and the microwave switch 400 includes the variable phase shifter 604 on one arm of the pump feeding the two three-wave mixers 402_1 and 402_2. The function of the 180° hybrid coupler 602 operates as discussed herein.

One option for implementing a variable phase shifter on-chip is using a symmetric two-port resonator with a dc-SQUID at its center, whose maximum frequency is equal to the pump frequency. By slightly shifting the resonance frequency within the resonator bandwidth, the phase of the transmitted pump can be shifted between 0° to 90°. One challenge of using this option is balancing the amplitude of the pump feeding the other JPC stage because the amplitude of the transmitted pump Signal through the resonator is expected to be attenuated in the range 0-3 dB when the resonance frequency is shifted.

Figure 9:
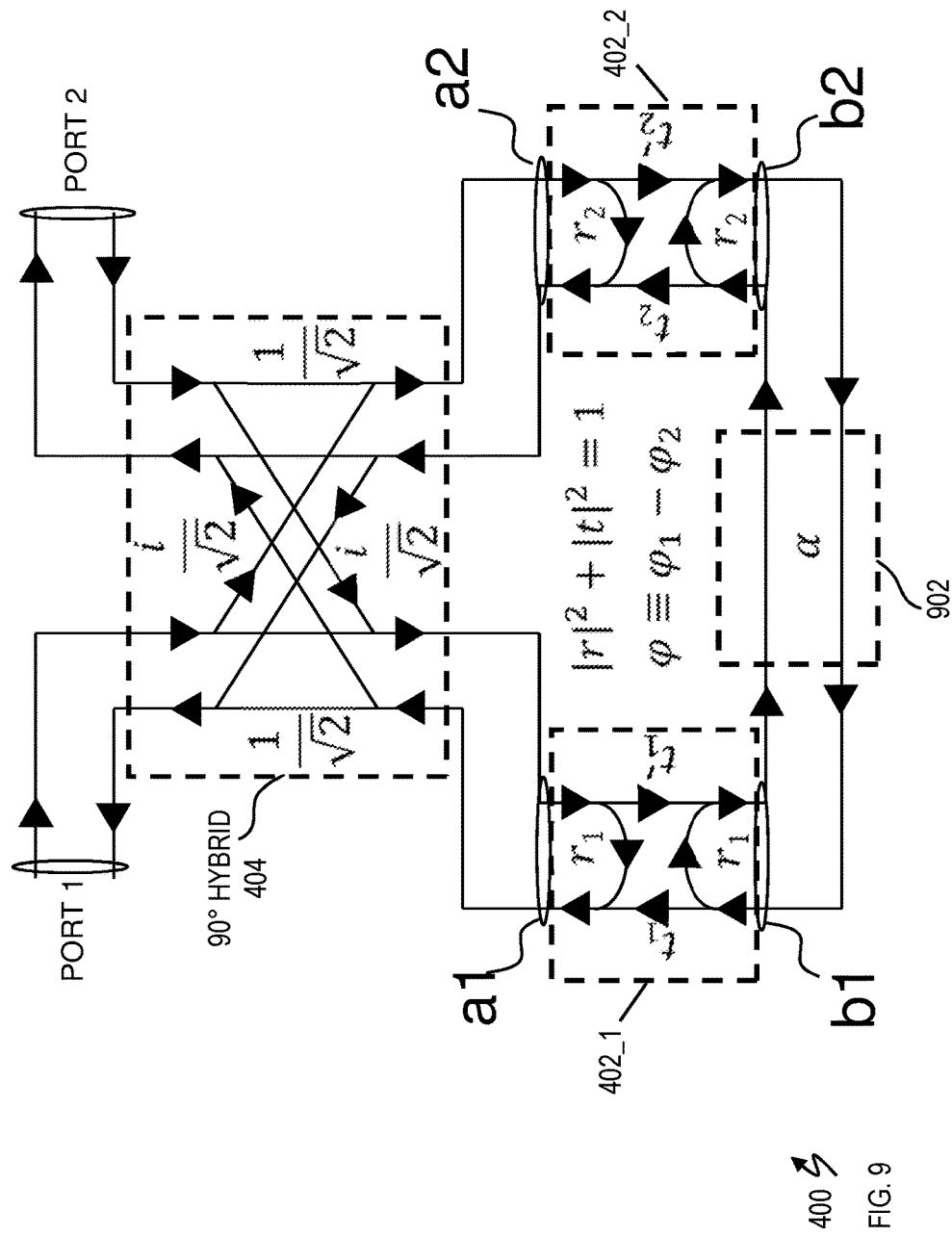
FIG. 9 depicts a signal flow graph of the lossless variable-transmission two-port microwave switch according to embodiments of the present invention.

FIG. 9 depicts a signal flow graph of the superconducting microwave switch/device 400 according to embodiments of the present invention. The two ports b1 and b2 of the mixers 402_1 and 402_2 (two active beam splitters) which support signals at $f_2$ are connected together through a delay line 902 (e.g., a lossless transmission line). In one implementation, the delay line 902 is not present. The signal flow graph shows the signal flow through ports 1 and 2, the 90° hybrid coupler 404, the mixer 402_1, the mixer 402_2, and the delay line 902. The scheme for the signal flow is lossless. The lossless delay line 902 should have an effective electrical length of multiples of π radians at the frequency of the ports b1 and b2 that are connected together. The two active beam splitters are (assumed to be) nominally identical. The scattering parameters of the microwave device 400 at a certain working point are determined by wave interference between 4 principal paths (although there are multiple (or infinite paths)). The scattering parameter on resonance from port i to j (where i,∈{1,2}) vanishes if the waves that propagate from i to j interfere destructively. The scattering parameter on resonance from port i to j (where i,∈{1,2}) is almost unity if the waves that propagate from i to j interfere constructively.

The pump is assumed to be enabled where $|r|^2+|t|^2=1$ and the phase difference is $\equiv \varphi_1-\varphi_2$. The phase shift is defined as $\alpha=e^{i\varphi_d}$. Phase shift acquired by signals propagating along the transmission line 902 (between ports b1 and b2) at $f_2$ is $\varphi_1=\omega_2\tau_d$. The angular frequency of microwave signals at $f_2$ is $\omega_2=2\pi f2$. The delay time of the delay/transmission line 902 is $\tau_d=l_d\sqrt{\varepsilon}/c$, where c is the speed of light, $l_d$ is the effective electrical length of the transmission line (902), and ε is the effective dielectric constant of the transmission line.

In the signal graph of FIG. 9, $r_1$ and $r_2$ are the reflection coefficients, $t_1$, $t'_1$, $t_2$, and $t'_2$ are the transmission parameters of mixers 402_1 and 402_2 respectively, where $t'_1=-t*_1$ (where $t*_1$ is the conjugate of $t_1$) and where $t'_2=-t*_2$ (where $t*_2$ is the conjugate of $t_2$). It is presumed that $t_1$ is equal to or about equal to $t_2$ and $r_1$ is equal to or about equal to $r_2$.

It should be appreciated that there are numerous paths for the signal at $f_1$ entering the port 1 to follow in the microwave switch 400 and/or the signal at $f_1$ entering the port 2 to follow. For any signal at $f_1$ entering the port 1 or port 2, wave interference results in 4 principal paths that determine transmission and/or reflection, based on the phase difference φ.

For ease of understanding and explanation, headings are utilized below. It should be appreciated that the headings are not meant to be limiting.

I. Device Equations Based on the Signal Flow Graph

The following are device equations for the microwave switch 400 based on the signal flow graph according to embodiments of the present invention.

First, using the scattering matrix $$[S] = \begin{pmatrix} S_{11} & S_{12} \\ S_{21} & S_{22} \end{pmatrix},$$

the scattering parameters on the diagonal are $S_{11}$ and $S_{22}$ which define the reflection parameters. The scattering parameters on the off diagonal are $S_{21}$ and $S_{22}$ which define the transmission parameters. The results of the S matrix are (Equations A)

$$S_{11}=\tfrac{1}{2}(S_{a1a1}-S_{a2a2}+iS_{a2a1}+iS_{a1a2})$$

$$S_{22}=\tfrac{1}{2}(S_{a2a2}-S_{a1a1}+iS_{a2a1}+iS_{a1a2})$$

$$S_{21}=\tfrac{1}{2}(iS_{a1a1}-iS_{a2a2}+S_{a2a1}+iS_{a1a2})$$

$$S_{12}=\tfrac{1}{2}(iS_{a1a1}+iS_{a2a2}+S_{a1a2}-S_{a2a1})$$

Intermediate results are $$S_{a1a1} = r_1 + \frac{r_2 t_1 t'_1 \alpha^2}{1-r_1 r_2 \alpha^2}$$

$$S_{a1a2} = \frac{t_1 t'_2 \alpha}{1-r_1 r_2 \alpha^2}$$

$$S_{a2a2} = r_2 + \frac{r_1 t_2 t'_2 \alpha^2}{1-r_1 r_2 \alpha^2}$$

$$S_{a2a1} = \frac{t_2 t'_1 \alpha}{1-r_1 r_2 \alpha^2}$$

which can be rewritten as (Equations B)

$$S_{a1a1} = r_1 - \frac{e^{2i\varphi_d} r_2 |t_1|^2}{1-r_1 r_2 e^{2i\varphi_d}}$$

$$S_{a1a2} = -\frac{|t_1||t'_2|e^{i(\varphi_d-\varphi)}}{1-r_1 r_2 e^{2i\varphi_d}}$$

$$S_{a2a2} = r_2 - \frac{e^{2i\varphi_d} r_1 |t_2|^2}{1-r_1 r_2 e^{2i\varphi_d}}$$

$$S_{a2a1} = -\frac{|t_2||t'_1||\alpha|e^{i(\varphi_d+\varphi)}}{1-r_1 r_2 e^{2i\varphi_d}}$$

where $\equiv \varphi_1 - \varphi_2$.

It should be noted that, for example, the nomenclature $S_{21}$ represents a scattering parameter (transmission parameter) for a signal (at frequency $f_1$) entering from port 1 and exiting port 2, as understood by one skilled in the art. Similarly, for example, the nomenclature $S_{a1a2}$ represents a scattering parameter (transmission parameter) for a signal entering port a2 and exiting port a1. As can be seen in the equations above, $S_{11}$, $S_{22}$, $S_{21}$, and $S_{12}$ each have 4 principal paths given the wave interference as understood by one skilled in the art, although the actual different possible paths between port 1 and 2 (and vice versa) is numerous or infinite because of the self loop between the idler resonators (e.g., between coupled ports b1 and b2). However, the scattering parameters in Equations B account for all possible paths and subsequently the scattering parameters for the whole device in Equations A. Additionally, the scattering parameters $S_{11}$ and $S_{21}$ define the operation of the microwave switch 400 for a signal (at frequency $f_1$) entering port 1 which then exits port 1 or exits port 2 respectively. Likewise, scattering parameters $S_{22}$ and $S_{12}$ define the operation of the microwave switch 400 for a signal (at frequency $f_1$) entering port 2 which then exits port 2 or exits port 1 respectively.

II. Special Case of Nominally Identical Mixers Operated at the Same Working Point Now, turning to a special case of nominally identical mixers 402_1 and 402_2 operated at the same working point, the following relations are satisfied $r_1=r_2=r$, $|t_1|=|t'_1|=|t_2|=|t'_2|=t$ (which means that the mixers 402_1 and 402_2 are balanced), $\varphi \equiv \varphi_1 - \varphi_2$, and $|r|^2+|t|^2=1$. In this special case, the results of the S matrix are $$S_{a1a1} = S_{a2a2} = r \frac{1 - e^{2i\varphi_d}}{1 - r^2 e^{2i\varphi_d}}$$

$$S_{a1a2} = -\frac{t^2 e^{i(\varphi_d - \varphi)}}{1 - r^2 e^{2i\varphi_d}}$$

$$S_{a2a1} = -\frac{t^2 e^{i(\varphi_d + \varphi)}}{1 - r^2 e^{2i\varphi_d}}$$

which results (finally) in $$S_{11} = S_{22} = -\frac{it^2 e^{i\varphi_d}}{1 - r^2 e^{2i\varphi_d}} \cos(\varphi)$$

$$S_{21} = \frac{i}{1 - r^2 e^{2i\varphi_d}} (r(1 - e^{2i\varphi_d}) - t^2 e^{i\varphi_d} \sin(\varphi))$$

$$S_{12} = \frac{i}{1 - r^2 e^{2i\varphi_d}} (r(1 - e^{2i\varphi_d}) + t^2 e^{i\varphi_d} \sin(\varphi))$$

III. Special Case of Nominally Identical Mixers Operated at the Same Working Point Again, for a special case of nominally identical mixers 402_1 and 402_2 operated at the same working point, the following relations are satisfied $r_1=r_2=r$, $|t_1|=|t'_1|=|t_2|=|t'_2|=t$ (which means that the mixers 402_1 and 402_2 are balanced), $\varphi \equiv \varphi_1 - \varphi_2$, and $|r|^2+|t|^2=1$.

Additionally, for phase shifts acquired by on-resonance signals (for the idler resonators) at $f_2$ propagating along the transmission line $\varphi_d = \pi k$, where $k=0, \pm 1, \pm 2, \ldots$, the scattering parameters are as follows (Equations C):

$$S_{a1a1} = S_{a2a2} = 0$$

$$S a1a2 = -\frac{t2 e^{i\varphi_d} e^{-i\varphi}}{1 - r2} = -e^{-i\varphi}$$

-continued $$S_{a2a1} = -\frac{t^2 e^{i\varphi_d} e^{i\varphi}}{1 - r^2} = -e^{i\varphi}$$

which then results in $$S_{11} = S_{22} = -ie^{i\varphi_d} \cos(\varphi)$$

$$S_{21} = -ie^{i\varphi_d} \sin(\varphi))$$

$$S_{12} = ie^{i\varphi_d} \sin(\varphi)$$

Regardless of the values of r and t, as long a t>0 and r<1, the microwave switch 400 is turned on. The S matrix is $$[S] = -i \begin{pmatrix} \cos(\varphi) & -\sin(\varphi) \\ \sin(\varphi) & \cos(\varphi) \end{pmatrix}$$

where $-i$ is a global phase, which can be ignored. In an implementation, the global phase can be chosen arbitrarily and/or cannot be measured.

For the case when $\varphi_d=0$, the scattering parameters simplifies to (Equations D):

$$S_{11} = S_{22} = \cos(\varphi)$$

$$S_{21} = -\sin(\varphi)$$

$$S_{12} = \sin(\varphi)$$

As can be seen, these equations show that the scattering parameters of the S matrix are dependent upon the phase difference $\varphi$ of the pump signals, thereby determining whether there is a 1/−1 on the diagonal (meaning reflection, i.e., open switch), which is achieved for $\varphi=\pi k$, where $k=0, \pm 1, \pm 2, \ldots$, or whether there is a 1/−1 on the off diagonal (meaning transmission, i.e., a closed switch), which is achieved for $\varphi=(2k+1)*\pi/2$, where $k=0, \pm 1, \pm 2, \ldots$. This result also shows that for $\varphi$ that is between 0 and $\pi/2$ (or $\pi/2$ and $\pi$, and so forth) the switch can have variable reflection-transmission parameters. For example, for $\varphi=\pi/4$, the amplitude of the reflection and transmission parameters is equal to $1/\sqrt{2}$, which means the switch at this working point would function as a 50:50 beam-splitter: half of the signal power would be reflected back to the port of origin and half would be transmitted to the other port.

Figure 10A:
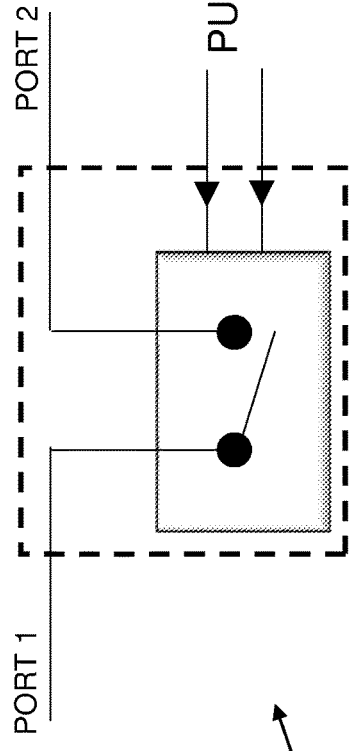
FIG. 10A depicts an example of the microwave switch at a working point according to embodiments of the present invention.
Figure 10B:
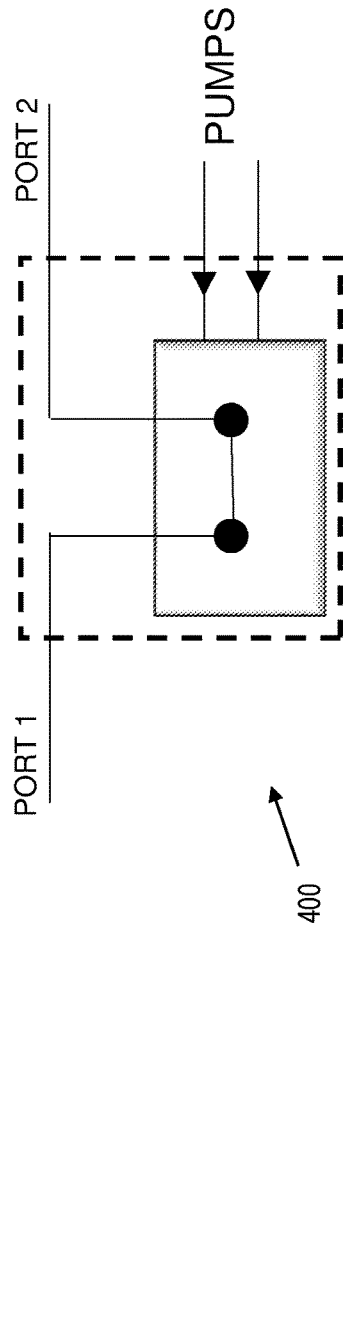
FIG. 10B depicts an example of the microwave switch at the same working point in FIG. 10A but with a different phase difference according to embodiments of the present invention.

FIG. 10A depicts an example of the microwave switch 400 at a working point according to embodiments of the present invention. FIG. 10B depicts an example of the microwave switch 400 at the same working point as in FIG. 10A except for having a different phase difference according to embodiments of the present invention. The microwave switch 400 is a multipath interferometric Josephson Switch (MPIJSW). FIG. 10A illustrates the microwave switch 400 as an open switch. In FIG. 10A, the nondegenerate microwave mixers that are part of the microwave switch 400 are operating at a 50:50 beam splitter point. In FIGS. 10A and 10B (discussed below), the three-wave mixers 402_1 and 402_2 are nominally identical (i.e., balanced or the same) and the amplitudes of their scattering parameters are given by $r_1=r_2=r=1/\sqrt{2}$ and $|t_1|=|t'_1|=|t_2|=|t'_2|=|t|=1/\sqrt{2}$. In the microwave switch 400 (of FIGS. 10A and 10B), the transmission amplitude of the delay line 902 is $|\alpha|=1$, while the phase shift acquired by propagating along the transmission line 902 at $f_2$ is $\omega_d=0$ (on resonance). In FIGS. 10A and 10B, the scattering matrix is $$[S]=-i\begin{pmatrix}\cos(\varphi)&-\sin(\varphi)\\\sin(\varphi)&\cos(\varphi)\end{pmatrix}.$$

In FIG. 10A, the phase difference in the pump signal(s) is φ=0 (which is different than in FIG. 10B). For φ=0, the scattering matrix becomes $$[S]=\begin{pmatrix}1&0\\0&1\end{pmatrix},$$

which shows ones (1s) on the diagonal (r) as an indication of reflection, thus being an open switch.

FIG. 10B depicts an example of the microwave switch 400 at the working point according to embodiments of the present invention. FIG. 10B includes the same parameters for the switch 400 as in FIG. 10A but FIG. 10B is a closed switch. However, in FIG. 10B, the phase difference between the pump signals is φ=π/2, resulting in the scattering matrix $$[S]=\begin{pmatrix}0&-1\\1&0\end{pmatrix},$$

which shows ones (1s) on the off diagonal (t) as an indication of transmission.

Figure 11A:
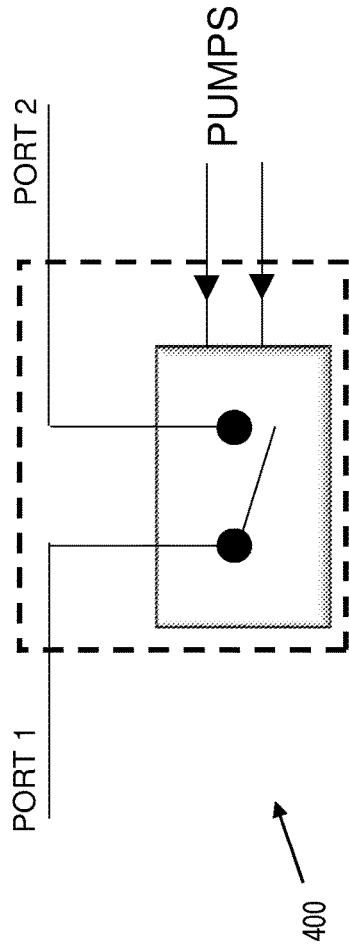
FIG. 11A depicts an example of the microwave switch at a working point according to embodiments of the present invention.
Figure 11B:
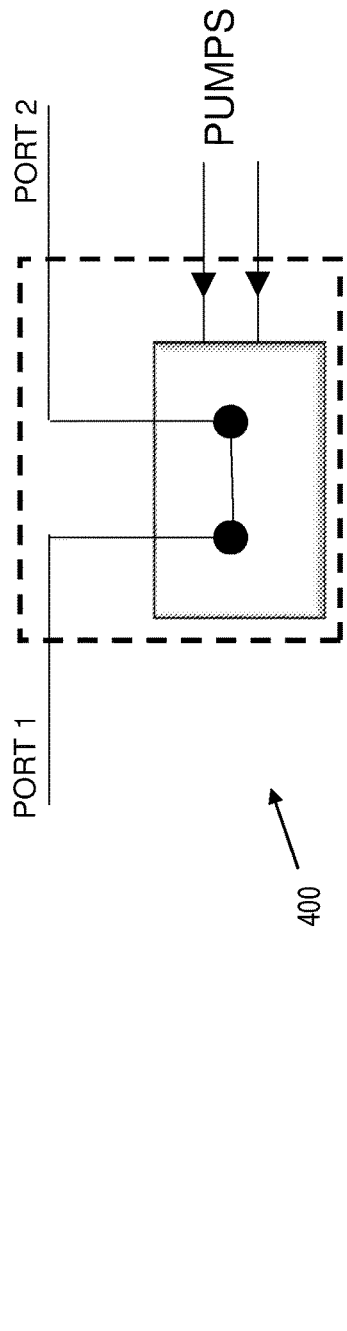
FIG. 11B depicts an example of the microwave switch at the same working point in FIG. 11A but with a different phase difference according to embodiments of the present invention.

FIG. 11A depicts an example of the microwave switch 400 at a working point according to embodiments of the present invention. FIG. 11B depicts an example of the microwave switch 400 at the same working point as in FIG. 11A except for having a different phase difference φ according to embodiments of the present invention.

FIG. 11A illustrates the microwave switch 400 as an open switch. In FIG. 11A, the nondegenerate microwave mixers that are part of the microwave switch 400 are operating at a 25:75 beam splitter point, which means that each mixer reflects ¼ of the signal power back to the origin port and transmits ¾ of the signal power to the other port with frequency conversion. In FIGS. 11A and 11B (discussed below), the three-wave mixers 402_1 and 402_2 are nominally identical (i.e., balanced or the same) and the amplitudes of their scattering parameters are given by $r_1=r_2=r=½$ and $|t_1|=|t'_1|=|t_2|=|t'_2|=|t|=\sqrt{3}/4$. In the microwave switch 400 (of FIGS. 10A and 10B), the transmission amplitude of the delay line 902 is $|\alpha|=1$, while the phase shift acquired by propagating along the transmission line 902 at $f_2$ is $\varphi_d=0$ (on resonance). In FIGS. 11A and 11B, the scattering matrix is $$[S]=-i\begin{pmatrix}\cos(\varphi)&-\sin(\varphi)\\\sin(\varphi)&\cos(\varphi)\end{pmatrix}.$$

In FIG. 11A, the phase difference in the pump signal(s) is φ=0 (which is different than in FIG. 11B). For φ=0, the scattering matrix becomes $$[S]=\begin{pmatrix}1&0\\0&1\end{pmatrix},$$

which shows ones (1s) on the diagonal (r) as an indication of reflection, thus being an open switch.

FIG. 11B depicts an example of the microwave switch 400 at the working point according to embodiments of the present invention. FIG. 11B includes the same parameters for the switch 400 as in FIG. 11A but FIG. 11B is a closed switch because of the phase difference. Particularly, in FIG. 11B, the phase difference between the pump signals is φ=π/2, resulting in the scattering matrix $$[S]=\begin{pmatrix}0&-1\\1&0\end{pmatrix},$$

which shows ones (1's) on the off diagonal (t) as an indication of transmission.

It should be recognized that the microwave device 400 can be controlled to be an open switch or a closed switch according to the phase difference as seen in FIGS. 10A, 10B, 11A, and 11B.

Now, turning to illustrations of wave interference, the microwave switch 400 is a multi-path interferometric Josephson switch (MPIJSW). For explanation purposes, a few multi-path interference examples (with respect to the phase) are provided for the microwave switch 400. FIGS. 12A, 12B, 12C, and 12D illustrate principal paths 1, 2, 3, and 4 respectively for $S_{21}$ according to embodiments. As noted above, the propagation of the signal for $S_{21}$ denotes that the signal at frequency $f_1$ is intended to propagate from port 1 to port 2 of the microwave switch 400. FIGS. 12A, 12B, 12C, 12D depict the 4 principal paths from port 1 to port 2 for the two three-wave mixers 402_1 and 402_2, which result in constructive interference. The three-wave mixers 402_1 and 402_2 are nominally identical (or balanced) unless noted otherwise. In this case r<1 and t>0, which means that the three-wave mixers 402_1 and 402_2 (JPCs) are ON. Also, the phase shift acquired by signals propagating along the transmission line 902 (in any direction between ports b1 and b2) at $f_2$ is $\varphi_d=0$ and the phase difference between pump 1 and pump 2 is φ=π/2.

FIG. 12A depicts path 1 of the microwave switch 400 for $S_{21}$ according to embodiments of the present invention. A signal at frequency $f_1$ and relative phase 0 is input to port 1 of the microwave switch 400 and this input is denoted as 1∠0°, which means that its normalized amplitude is 1 and its relative phase is 0°. Path 1 is illustrated. The destructive wave interference in this path results in a zero amplitude at port 2, as seen in Equations C.

FIG. 12B depicts path 2 of the microwave switch 400 for $S_{21}$ according to embodiments of the present invention. For the signal at frequency $f_1$ and relative phase 0 (1∠0°) input to port 1 of the microwave switch 400, the path 2 is illustrated and the destructive wave interference along this path results in a zero-amplitude transmitted signal along this path (at port 2), as seen in Equations C.

FIG. 12C depicts path 3 of the microwave switch 400 for $S_{21}$ according to embodiments of the present invention. For the signal at frequency $f_1$ and relative phase 0 (1∠0°) input to port 1 of the microwave switch 400, the path 3 is illustrated and the transmitted signal along this path at port 2 due to wave interference is ½∠0°. This means its normalized amplitude is ½ and its relative phase is 0°.

FIG. 12D depicts path 4 of the microwave switch 400 for $S_{21}$ according to embodiments of the present invention. For the signal at frequency $f_1$ and relative phase 0 (1∠0° input to port 1 of the microwave switch 400, the path 4 is illustrated and the transmitted signal along this path at port 2 due to wave interference is ½∠0°. This means its normalized amplitude is ½ and its relative phase is 0°.

The constructive interference between the 4 principal paths in FIGS. 12A-12D is $|S_{21}|=|2\cdot\frac{1}{2}|=1$. For the case when $\varphi_d=0$ and $\varphi=\pi/2$, the multi-path interference of $S_{21}$ can also be obtained by using the result shown in Equations D having $S_{21}=-i\sin(\varphi)$, which results in an amplitude of $|-1i|=1$.

Now, turning to other illustrations of wave interference for the microwave switch 400, FIGS. 13A, 13B, 13C, and 13D illustrate principal paths 1, 2, 3, and 4 respectively for $S_{22}$ according to embodiments. The propagation of the signal for $S_{22}$ denotes that the signal at frequency $f_1$ is intended to propagate from port 2 to port 2 of the microwave switch 400. FIGS. 13A, 13B, 13C, 13D depict the 4 principal paths from port 2 to port 2 for the two three-wave mixers 402_1 and 402_2, which result in destructive interference. The three-wave mixers 402_1 and 402_2 are nominally identical (or balanced) unless noted otherwise. In this case r<1 and t>0, which means that the three-wave mixers 402_1 and 402_2 (JPCs) are ON. Also, the phase shift acquired by signals propagating along the transmission line 902 (in any direction between ports b1 and b2) at $f_2$ is $\varphi_d=0$ and the phase difference between pump 1 and pump 2 is $\varphi=\pi/2$.

FIG. 13A depicts path 1 of the microwave switch 400 for $S_{22}$ according to embodiments of the present invention. A signal at frequency $f_1$ and relative phase 0 is input to port 2 of the microwave switch 400 and this input is denoted as 1∠0°, which means its normalized amplitude is 1 and its relative phase is 0. Path 1 is illustrated. The destructive wave interference in this path results in a zero amplitude at port 2, as seen in the Equations C.

FIG. 13B depicts path 2 of the microwave switch 400 for $S_{22}$ according to embodiments of the present invention. For the input signal at frequency $f_1$ and relative phase 0 (1∠0°) input to port 2 of the microwave switch 400, the path 2 is illustrated and the destructive wave interference along this path results in a zero amplitude return signal at port 2 as seen in the Equations C.

FIG. 13C depicts path 3 of the microwave switch 400 for $S_{22}$ according to embodiments of the present invention. For the input signal at frequency $f_1$ and relative phase 0 (1∠0°) input to port 2 of the microwave switch 400, the path 3 is illustrated and the constructive wave interference results in a return signal along this path with amplitude and phase ½∠180° at port 2. This means its normalized amplitude is ½ and its relative phase is 180°. This result can be seen in Equations C above as well as from the fact that the signal passes through the hybrid twice which attenuates it power by a factor 2.

FIG. 13D depicts path 4 of the microwave switch 400 for $S_{22}$ according to embodiments of the present invention. For the input signal at frequency $f_1$ and relative phase 0 (1∠0°) input to port 2 of the microwave switch 400, the path 4 is illustrated and the constructive wave interference results in a return signal along this path with amplitude and phase ½∠° at port 2. This means its normalized amplitude is ½ and its relative phase is 180°. This result can be seen in the Equations C above as well as from the fact that the signal passes through the hybrid twice which attenuates it power by a factor 2.

The destructive interference between the 4 principal paths in FIGS. 13A-13D is $|S_{22}|=|\frac{1}{2}-\frac{1}{2}|=0$. For the case when $\varphi_d=0$ and $\varphi=\pi/2$, the multi-path interference of $S_{21}$ can also be obtained by using $S_{22}=-i\cos(\varphi)$, which results in 0.

It is noted that the amplitude of the pump signal (whether pump signal 1 and pump signal 2 or a 180 hybrid coupler is utilized to split a single pump signal into pump signals 1 and 2) is utilized to operate the three-wave mixers employed in the device 400 and set their transmission t and reflection r parameters, but what determines whether the switch 400 is open, closed, or operating in a variable transmission-reflection amplitude switch mode in the embodiments of the present invention is the phase difference between the pump drives. It is again noted that a three-wave mixer scattering matrix $$[S] = \begin{pmatrix} r & t \\ t' & r \end{pmatrix} = \begin{pmatrix} \cos\theta & ie^{-i\varphi_P}\sin\theta \\ ie^{i\varphi_P}\sin\theta & \cos\theta \end{pmatrix},$$

where $\tan h(i\theta/2)=i|\rho|$ and $\rho$ is a dimensionless pump amplitude (varies between 0 and 1). The pump amplitude $\rho$ is given as a function of the angle $\theta$, which determines the reflection and transmission parameters.

The microwave switch 400 supports five operation modes, under the following conditions which are 1) $r_1=r_2=r$, 2) $|t_1|=|t'_1|=|t_2|=|t'_2|=t$, 3) $\varphi\equiv\varphi_1-\varphi_2$, 4) $|r|^2+|t|^2=1$, 5) $\varphi_d=\pi k$, where $k=0, \pm 1, \pm 2, \ldots$, and 6) the hybrid and the coupling transmission lines are lossless. FIG. 14 depicts the five operational modes in Table 1400 according to embodiments of the present invention. The modes are given for on resonance signals but also applies for a certain bandwidth around resonance which is equal to the bandwidth of the whole device (switch 400). The five modes of operation are 1) switch is closed with reciprocal transmission between its ports, 2) switch is closed with nonreciprocal phase shift for the transmitted signal between its ports, 3) switch is closed with variable transmission-reflection amplitude between its ports, 4) switch is open with unity reflection. For the last mode, the phase of the reflected signal is equal to the phase of the incident signal, and 5) switch is open with unity reflection. The phase of the reflected signal is shifted by 180 degree relative to the phase of the incident signal. The conditions for each mode of operation are listed in the Table 1400.

FIG. 15 depicts an example of the microwave switch 400 without illustrating the 90° hybrid coupler (for simplicity and conciseness) according to embodiments of the present invention. FIG. 16 depicts an example of the microwave switch 400 without illustrating the 90° hybrid coupler according to embodiments of the present invention. However, it should be appreciated that the hybrid coupler 404 is connected although not shown. Each of three-wave mixers 402_1 and 402_2 includes a Josephson ring modulator (JRM) 1510 which is a nonlinear dispersive element based on (4) Josephson tunnel junctions 1506 in an outer ring (and optionally (4) Josephson tunnel junction 1505) which can perform three-wave mixing of microwave signals at the quantum limit. Particularly, the JRM 1510 consists of four nominally identical Josephson junctions arranged in a Wheatstone bridge configuration.

Figure 17:
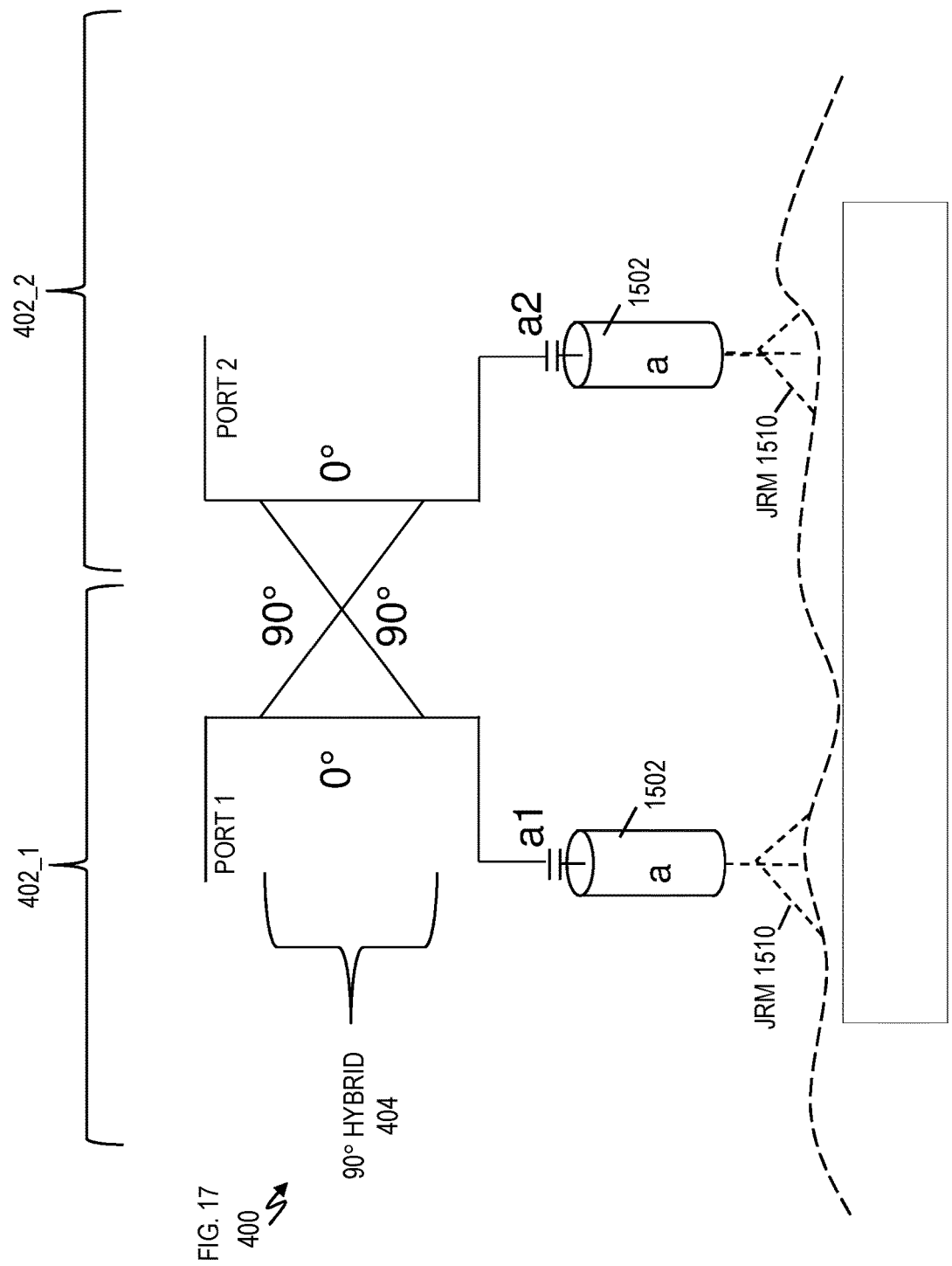
FIG. 17 depicts a partial view of the microwave switch illustrating connection of the resonators to the hybrid coupler according to embodiments of the present invention.

In each of the three-wave mixers 402_1 and 402_2, one of the microwave resonators is depicted as resonator_a 1502 and the other is resonator_b 1504. The resonators_a 1502 can be referred to as Signal resonators and the resonators_b 1504 can be referred to as Idler resonators. The resonators 1502 and 1504 are shown as transmission lines but the resonators 1502 and 1504 can be lumped elements, etc. In FIGS. 15 and 16, the 90° hybrid coupler 404 would be connected to ports a1 and a2. For example, FIG. 17 depicts port a1 from Signal resonator_a 1502 of mixer 402_1 connected to one leg of the 90° hybrid coupler 404 and port a2 from Signal resonator_a 1502 of mixer 402_2 connected to the opposite leg of the 90° hybrid coupler 404. FIG. 17 is only a partial view of the microwave switch 400 illustrating connection of the resonators 1502 to the hybrid coupler 404.

In FIGS. 15 and 16, the ports b1 and b2 are connected together. In one implementation, the delay line 902 could be inserted in between as discussed herein. There are various way of feeding the pump signals 1 and 2 to the three-wave mixers 402_1 and 402_2 which have equal amplitudes, same frequency $f_p$, but have a zero or nonzero phase difference. As one example, in FIGS. 15 and 16, the pumps p1 and p2 can be fed to on-chip flux lines (e.g., flux lines 1508) in the form of short-circuited coupled striplines that are capacitively coupled to two adjacent nodes of the JRM 1510. Such pump lines can both support microwave tones at the pump frequency and dc currents that flux bias the JRMs 1510. A low-pass filter 1512 can be coupled in between the pump port and the flux line 1508 to filter out higher frequency $f_1$ and $f_2$. Another way for flux biasing the JRMs is by using external magnetic coils attached to the mixers package and/or using a very small magnetic material integrated on chip or in the package. Another way to feed the pump drives is by using an on-chip 3-port power divider that capacitively couples to opposite nodes of the JRM 1510. Further, each resonator_a 1502 and resonator_b 1504 has two ends. FIG. 15 shows that one end of resonator_a 1502 is open, while the other is capacitively coupled to a feedline at point X1 which is port a1 in mixer 402_1. Similarly for mixer 402_2, one end of resonator_a 1502 is open, while the other is capacitively coupled to a feedline at point X2 which is port a2 in mixer 402_2. Furthermore, FIG. 15 shows that one end of resonator_b 1504 is open, while the other is capacitively coupled to a feedline at point Y1 which is port b1 in mixer 402_1. Similarly for mixer 402_2, one end of resonator_b 1504 is open, while the other is capacitively coupled to a feedline at point Y2 which is port a2 in mixer 402_2. One open end of the resonator_a 1502 or one open end of the resonator_b 1504 could be utilized to feed the pump signal, by adding weakly coupled feedlines to one of these ends.

Unlike FIG. 15, FIG. 16 shows that one end of resonator_a 1502 is capacitively coupled to port a1 (port a2 in mixer 402_2), which is connected to one port of the hybrid, while the other end is capacitively coupled to a feedline that is shorted to ground. Similarly, one end of resonator_1 1504 capacitively couples to port b1 (port b2 in mixer 402_2) and the other end is capacitively coupled to a feedline that is shorted to ground. The feedline of the resonator_a 1502 or one feedline of the resonator_b 1504 that is grounded could possibly be disconnected from ground and instead be utilized to feed the pump signal. In this case, the coupling capacitance between the pump feedline and the resonator should be small enough to prevent signal leakage through this designated pump feedline.

In one implementation of FIGS. 15 and 16, the 180° hybrid coupler 602 could be connected to pump ports p1 and p2, and the variable phase shifter 604 can be on one leg.

The circuit elements of the microwave switch 400 and connected to the microwave switch 400 can be made of superconducting material. The respective resonators and transmission/feed/pump lines are made of superconducting materials. The hybrid couplers can be made of superconducting materials. Examples of superconducting materials (at low temperatures, such as about 10-100 millikelvin (mK), or about 4 K) include niobium, aluminum, tantalum, etc. For example, the Josephson junctions are made of superconducting material, and their tunnel junctions can be made of a thin tunnel barrier, such as an oxide. The capacitors can be made of superconducting material separated by low-loss dielectric material. The transmission lines (i.e., wires) connecting the various elements are made of a superconducting material.

As understood by one skilled in the art, there are many different technical advantages and benefits of the microwave switch 400. The microwave switch 400 has more functionalities than any other switch (to be utilized for superconducting/quantum purposes) which include: reflector with same phase, reflector with phase negation, reciprocal transmission, nonreciprocal transmission, and variable-transmission-reflection beam-splitter. The microwave switch 400 is lossless, is easy to engineer, design, and fabricate, can be realized on chip using superconducting circuits or integrated into a PCB. The microwave switch 400 can be made broadband by engineering the impedance of the JPC feedlines, and implementing lumped-element JPCs. The microwave switch 400 can be made compact using lumped-element design of the hybrids and JPCs and requires no flux control or flux pulses. Additionally, because r and t do not need to be r=0 and t=1, the device 400 can be very stable over a long period of time (limited mainly by the dc-flux bias of the two JPCs) and it is easy to tune up. Also, because r and t do not need to be r=0 and t=1, the device 400 can have a large dynamic range (maximum input power) and the pump power feeding the device can be relatively small (less heating of the mixing chamber in a dilution refrigerator). Furthermore, other than having nominally identical JPCs (which is within the standard fabrication capabilities), there are no stringent requirements on uniformity or homogeneity. The microwave switch 400 can use one pump for all modes of operation, except the variable transmission-reflection beam splitter mode which requires two pump sources or one with phase shifter on one arm. The microwave switch 400 can be made using niobium (Nb) junctions and operated at 4K. The microwave switch 400 has fast switching times in the range of several nanoseconds (ns) (which is mainly limited by the bandwidth of the JPCs) and has large ON/OFF ratio of more than 20 decibels (dB).

Figure 18:
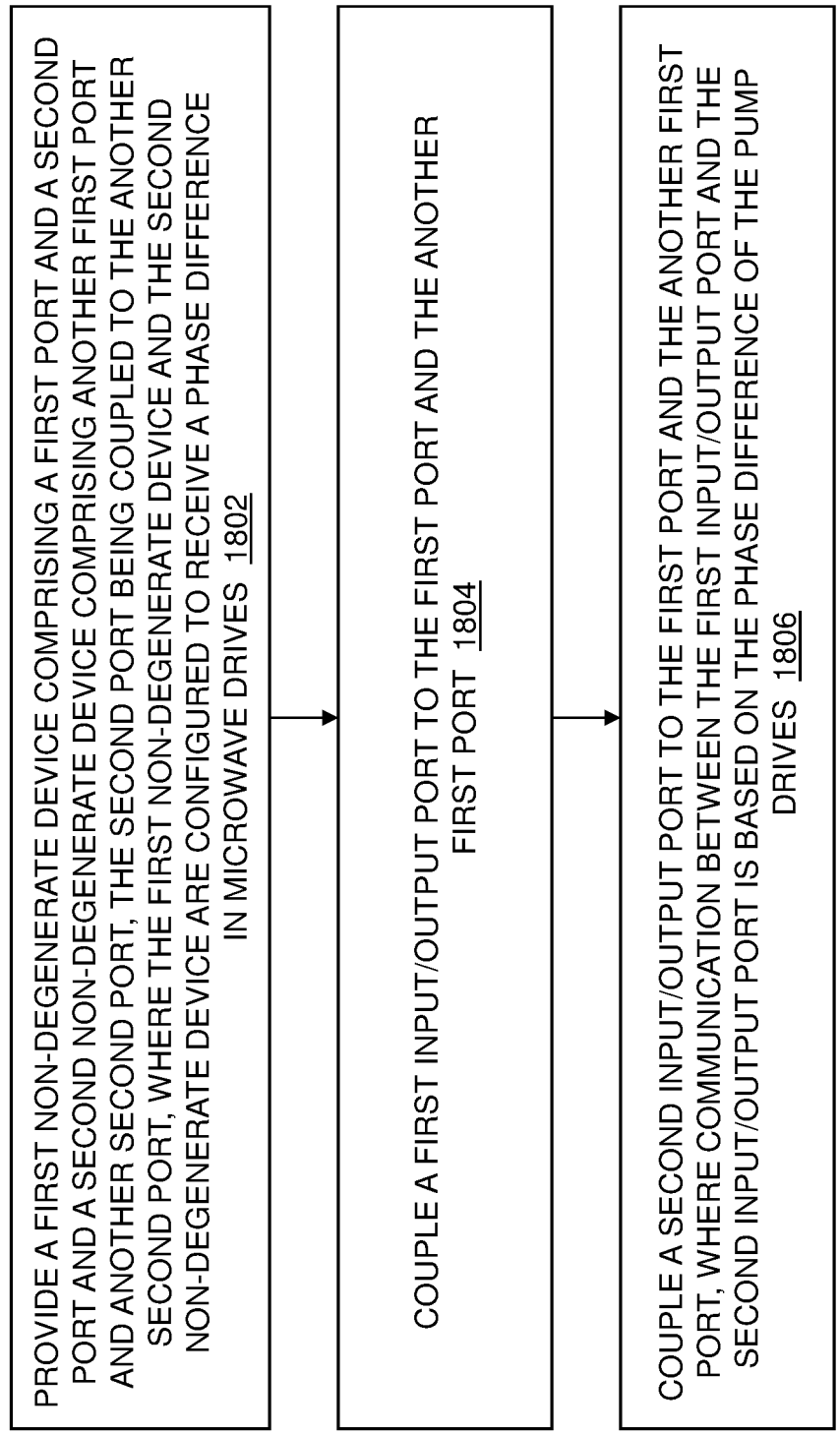
FIG. 18 depicts a flow chart of a method of forming/configuring a microwave switch according to embodiments of the present invention.

FIG. 18 depicts a flow chart 1800 of a method of forming/configuring a microwave switch 400 according to embodiments of the present invention. At block 1802, a first nondegenerate device 402_1 includes a first port a1 and a second port b1 and a second nondegenerate device 402_2 includes another first port a2 and another second port b2, the second port b1 being coupled to the another second port b2. For example, the coupling between the second port b1 and another second port b2 also represents/includes coupling between respective feedlines of, for example, the idler resonators_b 1504 in devices 402_1 and 402_2. The first nondegenerate device 402_1 and the second nondegenerate device 402_2 are configured to receive a phase difference φ in microwave drives (pump signal 1 and pump signal 2).

At block 1804, a first input/output port (port 1) is coupled to the first port a1 and the another first port a2. At block 1806, a second input/output port (port 2) is coupled to the first port a1 and the another first port a2, where communication between (signals (h) in one direction and/or the opposite direction) the first input/output port (port 1) and the second input/output port (port 2) is based on the phase difference φ between the pump drives feeding the three-wave mixers of the device 400.

The phase difference φ in the microwave drives is between a first microwave drive (pump signal 1) and a second microwave drive (pump signal 2). The first and second input/output ports (ports 1 and 2) are part of a hybrid coupler 404. A function of the first port a1 and the another first port a2 are configured to be analogous. In other words, the function and connection of ports a1 and a2 are identical or nearly identical in the three-wave mixers 402_1 and 402_2 respectively.

A variable phase shifter 604 is coupled to either the first nondegenerate device 402_1 or the second nondegenerate device 402_2. The variable phase shifter 604 is configured to determine/create the phase difference φ in the microwave drives.

The phase difference φ is configured to determine/control that the first input/output port (port 1) and the second input/output port (port 2) are in transmission mode. The phase difference φ is configured to determine/control that the first input/output port (port 1) and the second input/output port (port 2) are in reflection mode.

The phase difference between the microwave drives is configured to determine a variable transmission-reflection (between ports 1 and 2). The variable transmission-reflection is such that a transmission (such as a transmitting a signal at $f_1$) from the first input/output port (port 1) to the second input/output port (port 2) or vice versa is configured such that the transmission amplitude T for the signals varies between 0 and 1 and the reflection parameter R varies between 0 and 1. Where the reflection parameter of the whole device $S_{11}$ and $S_{22}$ and the transmission parameter of the whole device $S_{12}$ and $S_{21}$ satisfy the relations $|S_{11}|=|S_{22}|=R$, $|S_{12}|=|S_{21}|=T$, and $R^2+T^2=1$. Also, both R and T depend on the phase difference φ.

The first and second nondegenerate devices 402_1 and 402_2 are nondegenerate three-wave mixers in frequency conversion mode.

Figure 19:
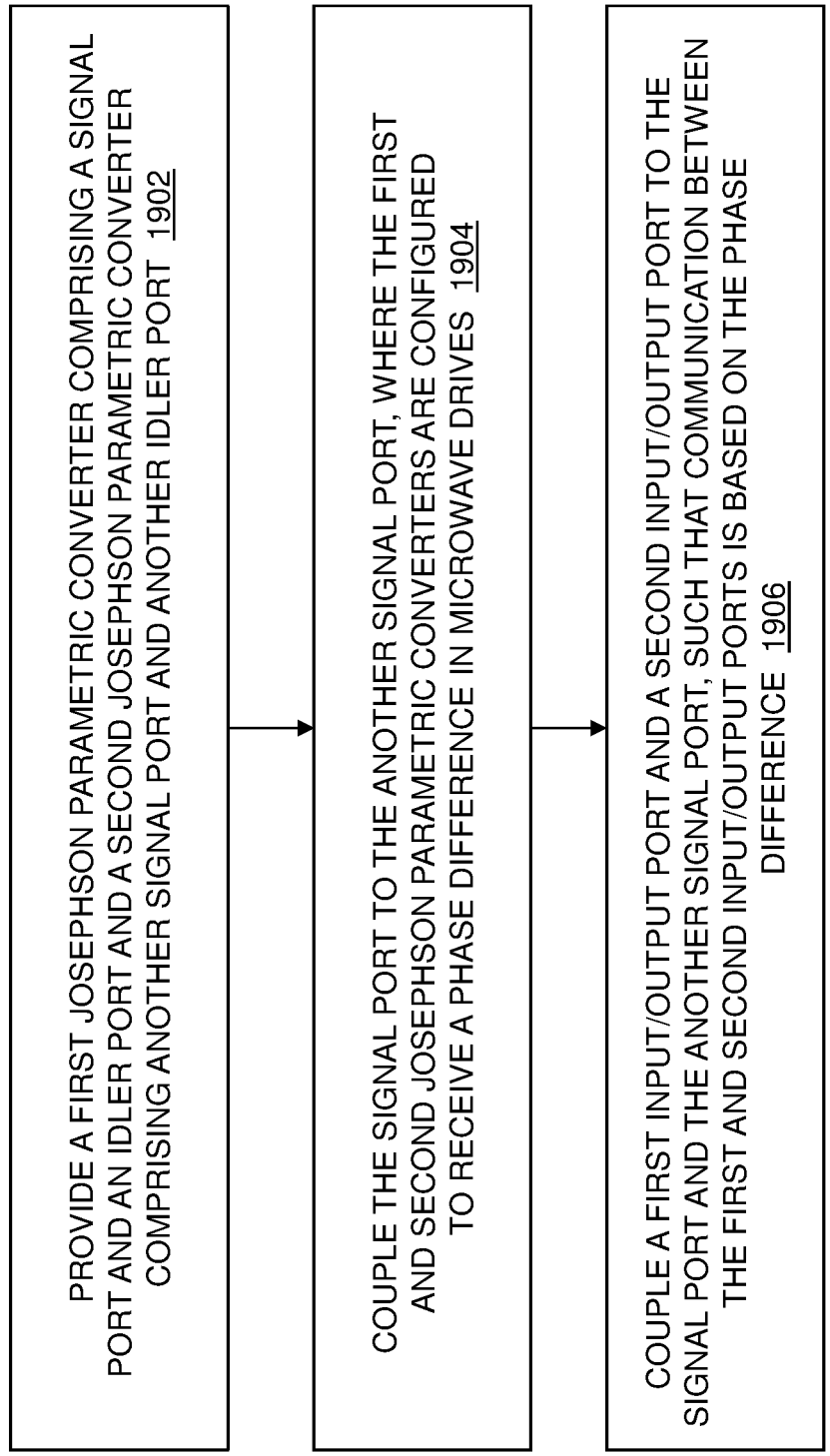
FIG. 19 depicts a flow chart of a method of forming/configuring a microwave switch according to embodiments of the present invention.

FIG. 19 depicts a flow chart 1900 of a method of forming/configuring a microwave switch 400 according to embodiments of the present invention. At block 1902, a first Josephson parametric converter 402_1 includes a Signal port a1 and an Idler port b2 and a second Josephson parametric converter 402_2 includes another Signal port a1 and another Idler port b2. At block 1904, the Signal port b1 is coupled to the another Signal port b2, where the first and second Josephson parametric converters are configured to receive a phase difference φ in microwave drives (pump signal 1 and pump signal 2). At block 1906, a first input/output port (port 1) and a second input/output port (port 2) are coupled to the Signal port a1 and the another Signal port a2, such that communication (e.g., signals at frequency $f_1$) between the first and second input/output ports (ports 1 and 2) is based on the phase difference.

The first Josephson parametric converter 402_1 includes a Signal resonator (e.g., resonator_a 1502) coupled to the Signal port a1 and the second Josephson parametric converter 402_2 includes another Signal resonator (e.g., resonator_a 1502) coupled to the another Signal port a2. The first Josephson parametric converter 402_1 includes an Idler resonator (e.g., resonator_b 1504) coupled to the Idler port b1 and the second Josephson parametric converter 402_2 includes another Idler resonator (e.g., resonator_b 1504) coupled to the another Idler port b2. One leg of a hybrid coupler 404 is coupled to the Signal port a1 and another leg of the hybrid coupler 404 is coupled to the another Signal port a2.

FIG. 20 depicts a flow chart 2000 of a method of operating a microwave switch 400 according to embodiments of the present invention. At block 2002, the microwave switch 400 receives a signal ($f_1$) at one of a first input/output port (port 1) and a second input/output port (port 2). At block 2004, the microwave switch 400 receives pump signals (pump signals 1 and 2) having a phase difference φ. At block 2006, communication (from port 1 to 2 and/or port 2 to 1) of the signal between the first input/output port (port 1) and the second input/output port (port 2) is controlled based on the phase difference.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to superconducting device and integrated circuit (IC) fabrication may or may not be described in detail herein. By way of background, however, a more general description of the superconducting device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a superconducting over a dielectric (e.g., silicon) substrate, some of which are described in the immediately following paragraphs.

In general, the various processes used to form a microchip that will be packaged into an IC fall into general categories, including, film deposition, removal/etching, and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Films of both conductors (e.g., poly-silicon, aluminum, copper, etc.) and insulators (e.g., various forms of silicon dioxide, silicon nitride, etc.) are used to connect and isolate components. Lithography is the formation of three-dimensional relief images or patterns on the semiconductor substrate for subsequent transfer of the pattern to the substrate. In lithography, the patterns are formed by a light sensitive polymer called a photo-resist. To build the complex structures of a circuit, lithography and etch pattern transfer steps are repeated multiple times. Each pattern being printed on the wafer is aligned to the previously formed patterns and slowly the conductors, insulators and other regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A microwave switch comprising:
   a first nondegenerate device comprising a first port and a second port; and
   a second nondegenerate device comprising another first port and another second port, the second port being coupled to the another second port, wherein the first nondegenerate device and the second nondegenerate device are configured to receive a phase difference in microwave drives.

2. The microwave switch of claim 1, wherein the first port and the another first port are configured to couple to a first input/output port.

3. The microwave switch of claim 2, wherein the first port and the another first port are configured to couple to a second input/output port; and
   wherein communication between the first input/output port and the second input/output port is based on the phase difference.

4. The microwave switch of claim 1, wherein the phase difference in the microwave drives is between a first microwave drive and a second microwave drive.

5. The microwave switch of claim 3, wherein:
   the first and second input/output ports are part of a hybrid coupler; and
   a function of the first port and the another first port are configured to be equivalent in the first nondegenerate device and the second nondegenerate device respectively.

6. The microwave switch of claim 1, wherein a variable phase shifter is coupled to the first nondegenerate device or the second nondegenerate device.

7. The microwave switch of claim 6, wherein the variable phase shifter is configured to create the phase difference in the microwave drives.

8. The microwave switch of claim 3, wherein the phase difference is configured to determine that the first input/output port and the second input/output port are in transmission mode.

9. The microwave switch of claim 3, wherein the phase difference is configured to determine that the first input/output port and the second input/output port are in reflection mode.

10. The microwave switch of claim 1, wherein the phase difference between the microwave drives is configured to determine a variable transmission-reflection mode.

11. The microwave switch of claim 1, wherein the first and second nondegenerate devices are nondegenerate three-wave mixers.

12. A method of configuring a microwave switch, the method comprising:
    providing a first nondegenerate device comprising a first port and a second port and a second nondegenerate device comprising another first port and another second port; and
    coupling the second port being to the another second port, wherein the first nondegenerate device and the second nondegenerate device are configured to receive a phase difference in microwave drives.

13. The method of claim 12, wherein the first port and the another first port are configured to couple to a first input/output port.

14. The method of claim 13, wherein the first port and the another first port are configured to couple to a second input/output port; and
    wherein communication between the first input/output port and the second input/output port is based on the phase difference.

15. The method of claim 12, wherein the phase difference in the microwave drives is between a first microwave drive and a second microwave drive.

16. The method of claim 14, wherein:
the first and second input/output ports are part of a hybrid coupler; and
a function of the first port and the another first port are configured to be equivalent in the first nondegenerate device and the second nondegenerate device respectively.

17. The method of claim 12, wherein a variable phase shifter is coupled to the first nondegenerate device or the second nondegenerate device.

18. The method of claim 17, wherein the variable phase shifter is configured to create the phase difference in the microwave drives.

19. A microwave switch comprising:
a first Josephson parametric converter comprising a Signal port and an Idler port; and
a second Josephson parametric converter comprising another Signal port and another Idler port, the Signal port and the another Signal port being coupled together, wherein the first and second Josephson parametric converters are configured to receive a phase difference in microwave drives.

20. The microwave switch of claim 19, further comprising a first input/output port and a second input/output port coupled to the Signal port and the another Signal port, such that communication between the Signal and another Signal ports is based on the phase difference.

* * * * *